(12) United States Patent
Palaskas et al.

(10) Patent No.: US 7,180,939 B2
(45) Date of Patent: Feb. 20, 2007

(54) ACTIVE FILTER CIRCUIT WITH DYNAMICALLY MODIFIABLE INTERNAL GAIN

(75) Inventors: George Palaskas, Portland, OR (US); Yannis Tsividis, New York, NY (US); Laszlo Toth, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 572 days.

(21) Appl. No.: 10/450,804

(22) PCT Filed: Jan. 10, 2002

(86) PCT No.: PCT/US02/04668

§ 371 (c)(1),
(2), (4) Date: Dec. 17, 2003

(87) PCT Pub. No.: WO02/056558

PCT Pub. Date: Jul. 18, 2002

(65) Prior Publication Data

US 2004/0091035 A1 May 13, 2004

Related U.S. Application Data

(60) Provisional application No. 60/288,976, filed on May 4, 2001, provisional application No. 60/260,722, filed on Jan. 10, 2001.

(51) Int. Cl.
*H03H 7/30* (2006.01)

(52) U.S. Cl. .................. 375/229; 327/553
(58) Field of Classification Search ............ 375/229; 708/300; 327/553
See application file for complete search history.

(56) References Cited

U.S. PATENT DOCUMENTS

| 4,509,019 | A | * | 4/1985 | Banu et al. ............ 330/107 |
| 5,608,665 | A | * | 3/1997 | Wyszynski ............ 708/819 |
| 5,724,433 | A | * | 3/1998 | Engebretson et al. .... 381/106 |
| 5,798,670 | A | * | 8/1998 | Lee .................... 327/552 |

OTHER PUBLICATIONS

Blumenkrantz, "The analog floating point technique", IEEE Symposium on Low Power Electronics, 1995, Oct. 9-11, 1995 pp. 72-73.*
Tsividis, "Externally linear, time-invariant systems and their application to companding signal processors", IEEE Transactions on Circuits and Systems II: Analog and Digital Signal Processing, vol. 44, Issue 2, Feb. 1997 pp. 65-85.*

* cited by examiner

Primary Examiner—Temesghen Ghebretinsae
Assistant Examiner—Juan Alberto Torres
(74) Attorney, Agent, or Firm—Baker Botts LLP

(57) ABSTRACT

Techniques are provided for the implementation of a signal processing circuit (100) which expands the dynamic range of the signal processing circuit (100) without interrupting the output of the circuit. The techniques can receive an input signal (104), process the signal (104) through one of a plurality of dynamically modifiable signal processing circuits, and switch (130) to processing the signal through another of the plurality of signal processing circuits without disturbing the output of the system.

21 Claims, 10 Drawing Sheets

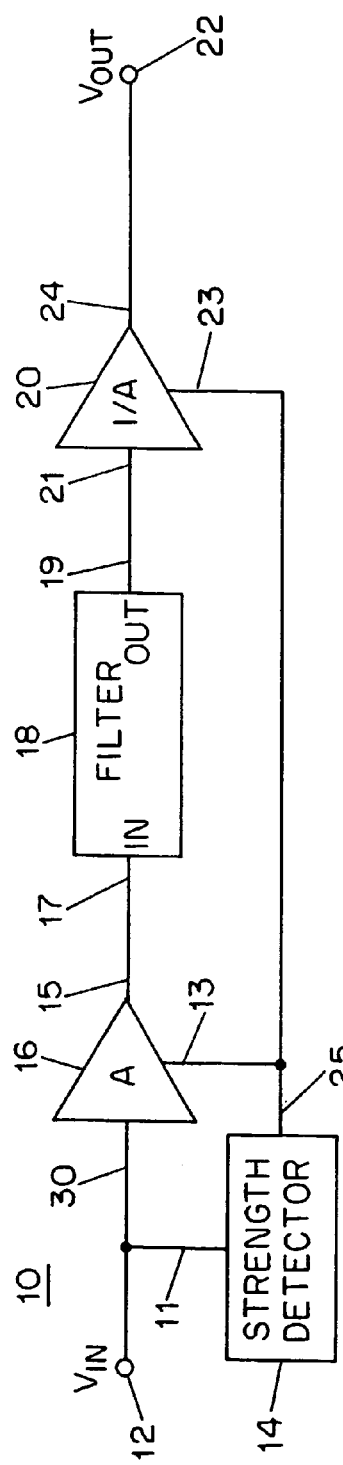
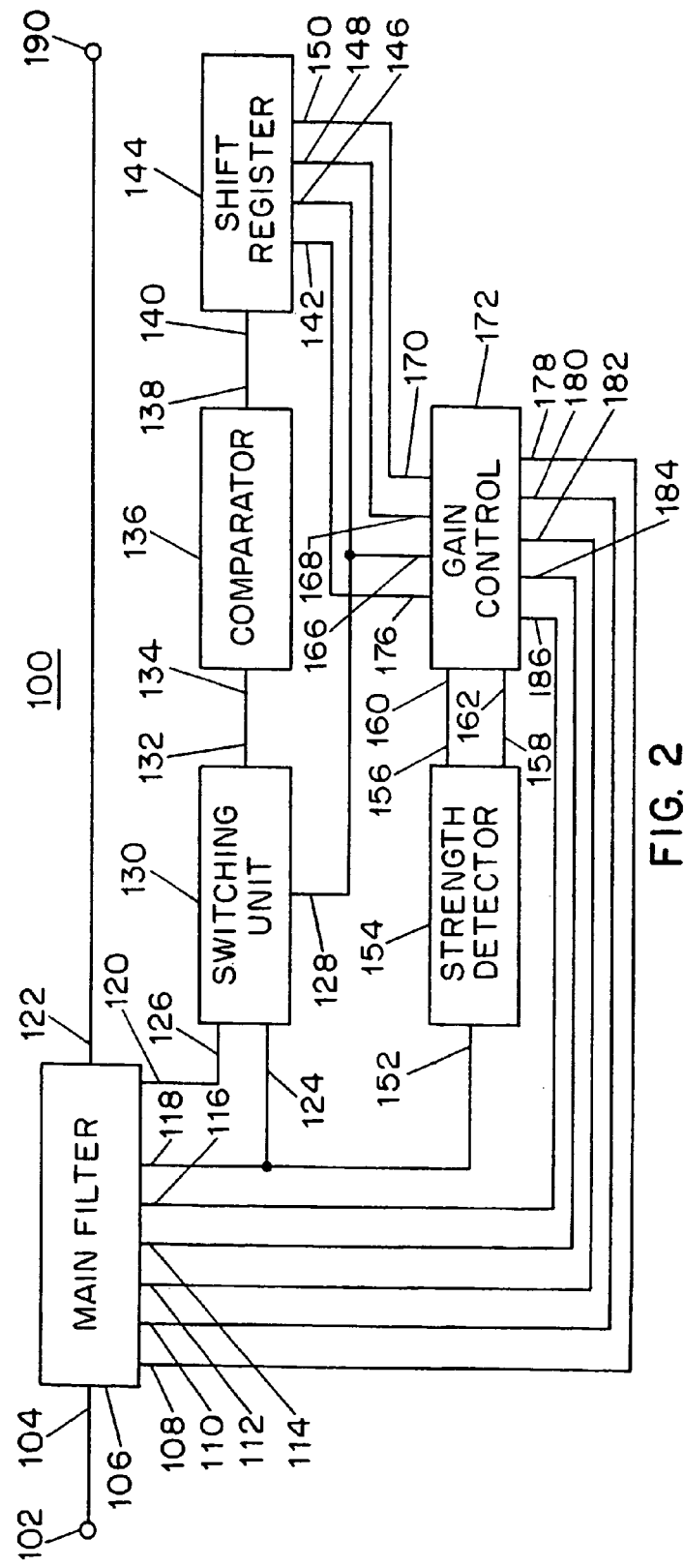

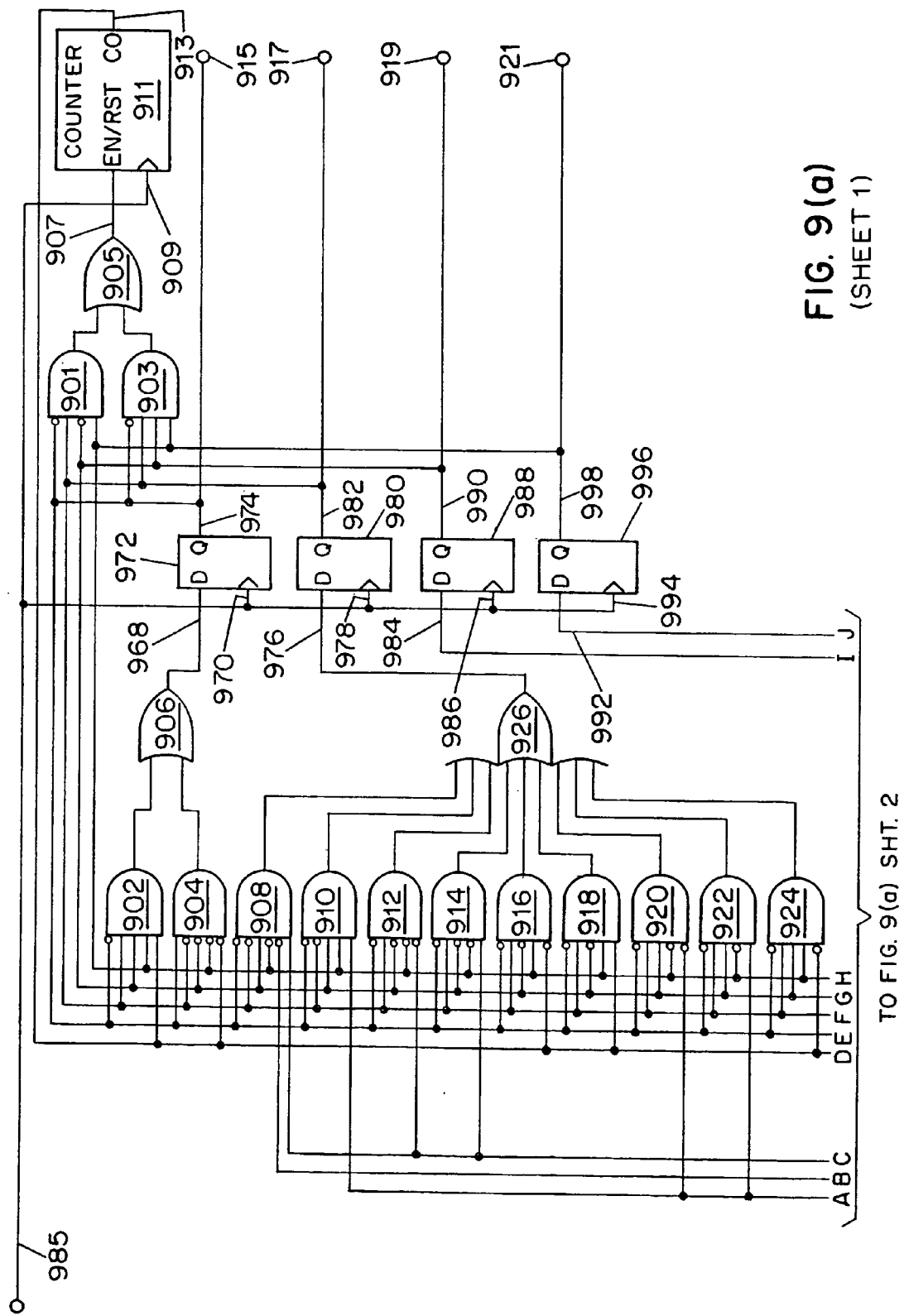
FIG. 9(a) (SHEET 1)

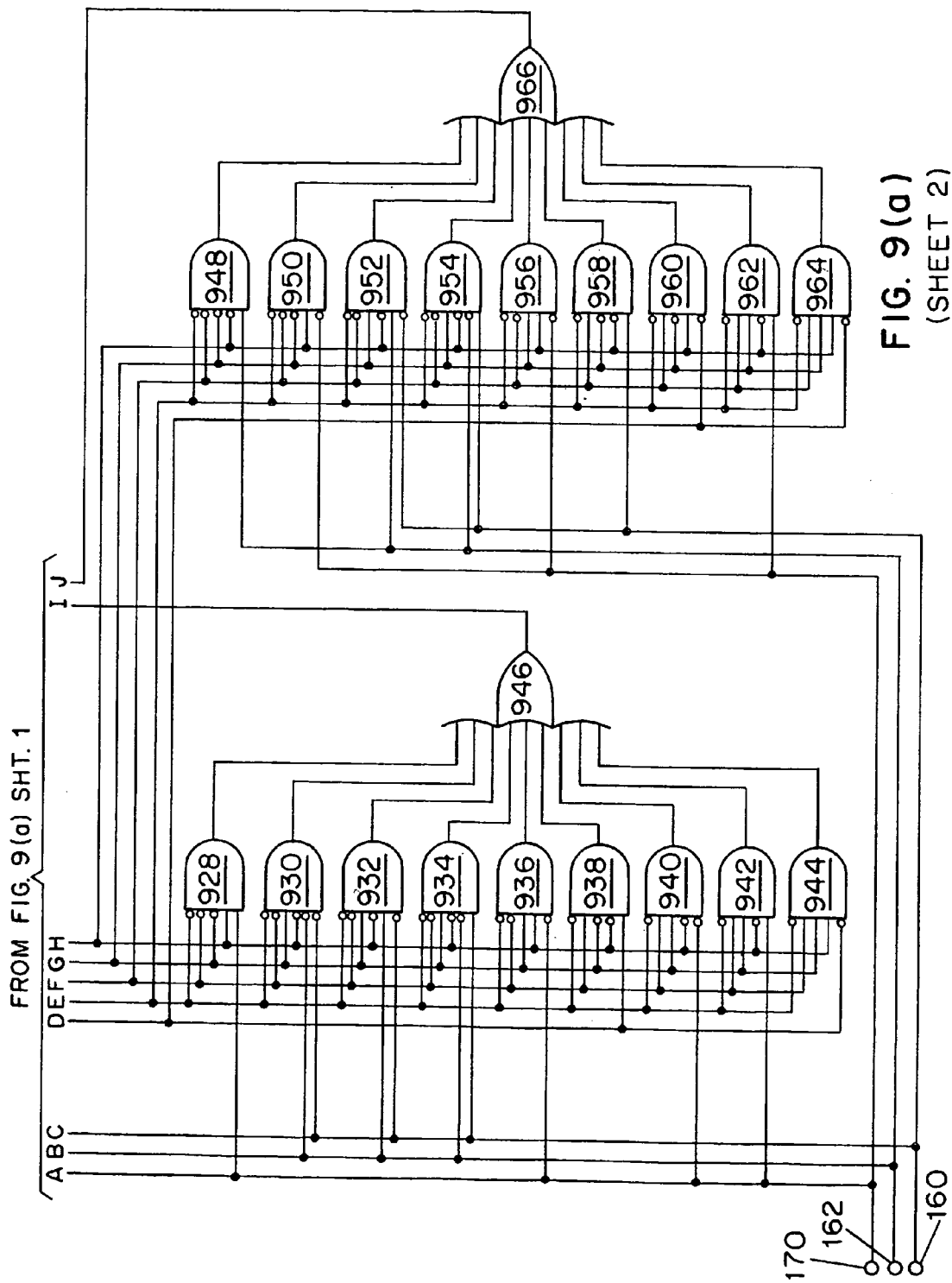
FIG. 9(a) (SHEET 2)

ACTIVE FILTER CIRCUIT WITH DYNAMICALLY MODIFIABLE INTERNAL GAIN

This application claims priority to U.S. Provisional Application Ser. No. 60/260,722 filed Jan. 10, 2001, and U.S. Provisional Application Ser. No. 60/288,976 filed May 4, 2001, each of which is incorporated by reference herein in its entirety.

BACKGROUND OF THE INVENTION

The present invention relates to signal processors and, more particularly, to signal processors that are dynamically modifiable for optimal performance and reduced power dissipation.

In order to expand the dynamic range of a signal processing system, companding signal processors can be used. A companding signal processor uses an input amplifier to amplify or attenuate a signal before it is provided to a signal processor, and an output amplifier is used to amplify or attenuate the signal provided by the signal processor. A signal processing circuit or signal processor includes an active filter. The gain of the output amplifier is the inverse of the gain of the input amplifier, thus conserving the overall gain of the signal processor. Ideally, the gains of the input amplifier and output amplifier should be dynamically variable. A signal strength detector can be used to measure the strength of the input signal and provide a processor appropriate gain control signal to the input amplifier and the output amplifier. See Y. Tsividis, "Externally linear, time-invariant systems and their application to companding signal processors," IEEE Transactions on Circuits and Systems II, Vol. 44, No. 2, February 1997. The gain control signal sets the amplification factors of the input amplifier and the output amplifier. However, this approach has the problem in that because the signal processor has memory, distortion in the output of the signal processor occurs whenever the amplification factors of the input amplifier and the output amplifier are changed.

The analog floating point technique addresses the problem of distortion in the output whenever the amplification factors change. See E. Blumenkrantz, "The analog floating point technique," Proc. IEEE Symposium on Low Power Electronics, p. 72–73, 1995. This technique avoids distortion by altering the state variables of the signal processor when the amplification factors change. However, implementation of the analog floating point technique is complicated, and is sensitive to parasitics and component mismatch. Accordingly, there is a need for circuits which expand the dynamic range of a signal processor without interrupting the output of the system or causing distortion.

SUMMARY OF THE INVENTION

It is therefore an object of this invention to provide a circuit which has a large dynamic range and which operates in an energy-efficient manner without interrupting the output of the circuit or causing distortion.

In accordance with the present invention, there is provided an active filter system including a system input for receiving a system input signal, a system output for providing a system output signal, a main filter, a strength detector, a zero crossing detector and a gain control unit. The main filter having at least one successive filter stage having an input and an output, including a first filter stage, each filter stage having an associated input amplification stage including a signal input, a signal output coupled to the input of the associated filter stage and a gain control input for receiving a gain control signal that determines the amplification factor of the associated input amplification stage, the input of the input amplification stage associated with each filter stage, except for the input amplification stage associated with the first filter stage, being coupled to the output of a preceding filter stage, if any, the input of the amplification stage associated with the first filter stage being coupled to the system input, each filter stage having an associated output amplification stage including a signal input coupled to the output of the associated filter stage, a signal output and a gain control input for receiving a gain control signal that determines the amplification factor of the associated output amplification stage, the signal output of the output amplification stage associated with a selected one of the at least one filter stage being coupled to the system output. The strength detector having an input coupled to the output of the first filter stage, and having a first output and a second output for providing respective output signals indicative of whether the first filter stage is approaching saturation or is providing an output signal having less than a minimum acceptable signal to noise ratio. The zero crossing detector having at least one input coupled to respective ones of the at least one output of the at least one filter stage of the main filter, and having at least one output for providing at least one signal indicative of when a successive one of the at least one filter stage of the main filter provides a signal at its output that is approximately equal to zero. The gain control unit having a first input and a second input respectively coupled to the output of the strength detector and coupled to the at least one output of the zero crossing detector, and having a multiplicity of outputs for providing respective gain control signals to the gain control input of each input amplification stage and each output amplification stage associated with the at least one filter stage of the main filter, the gain control unit being responsive to signals provided initially by the strength detector indicative of the first filter stage approaching saturation or providing an output signal having less than the minimum acceptable signal to noise ratio, and a signal from the zero crossing detector indicative of the output signal provided by the first filter stage being approximately equal to zero for providing a gain control signal to the gain control input of the input amplification stage associated with the first filter stage so that the input amplification stage associated with the first filter stage has an amplification factor that results in a signal strength at its signal output which avoids saturation of the first filter stage and avoids the first filter stage providing a signal having less than the minimum acceptable signal to noise ratio, and for providing a gain control signal to the gain control input of the output amplification stage associated with the first filter stage so that the output amplification stage associated with the first filter stage has an amplification factor which is the reciprocal of the amplification factor of the input amplification stage associated with the first filter stage, the gain control unit being thereafter responsive to signals provided initially by the strength detector indicative of the first filter stage of the main filter approaching saturation or providing an output having less than the minimum acceptable signal to noise ratio, and to a signal from the zero crossing detector indicating that an output signal at the output of a successive filter stage, if any, being approximately equal to zero for providing a gain control signal to the gain control input of the input amplification stage associated with the successive filter stage so that the input amplification stage associated with the successive filter stage has an amplification factor that results in a signal strength at its signal output that avoids saturation of the successive filter stage and avoids the successive filter stage providing a signal having less than the minimum acceptable signal to noise ratio, and for providing a gain control signal to the gain control input of the output amplification stage associated with the successive filter stage so that the output amplification stage associated with the successive filter stage has an amplification factor which is a reciprocal of the amplification factor of the input amplification stage associated with the successive filter stage.

BRIEF DESCRIPTION OF THE DRAWINGS

Further objects, features, and advantages of the invention will become apparent from the following detailed description taken in conjunction with the accompanying figures showing illustrative embodiments of the invention, in which:

FIG. 1 is a block diagram illustrating a prior art signal processing system;

FIG. 2 is a block diagram illustrating a signal processing system in accordance with the present invention;

Figure 3:
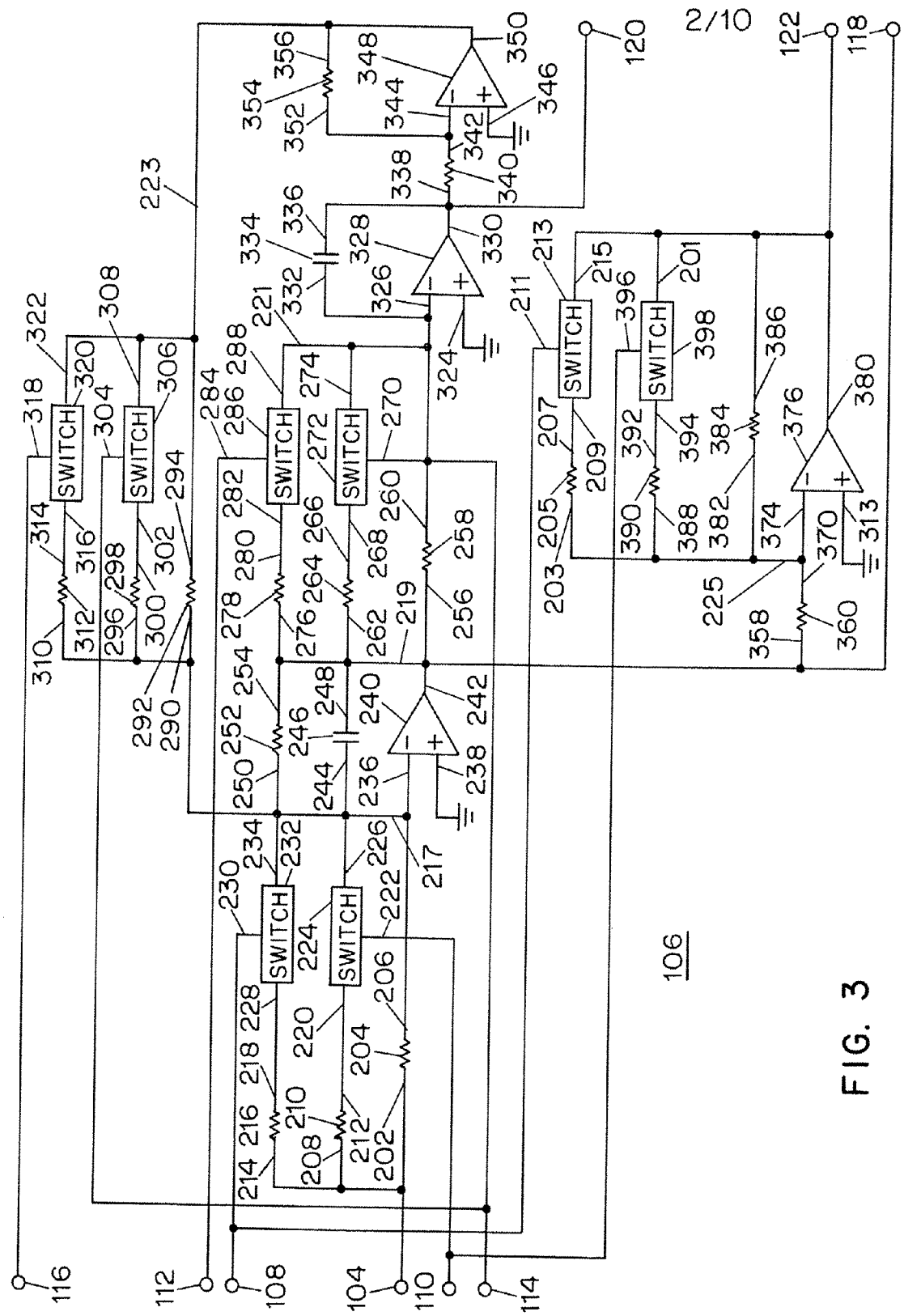
FIG. 3 is a circuit diagram illustrating the main filter of a signal processing system in accordance with the present invention.

Throughout the figures, unless otherwise stated, the same reference numerals and characters are used to denote like features, elements, components, or portions of the illustrated embodiments. Moreover, while the subject invention will now be described in detail with reference to the figures, and in connection with the illustrative embodiments, various changes and modifications to the described embodiments will be apparent to those skilled in the art without departing from the true scope and spirit of the subject invention as defined by the appended claims.

DETAILED DESCRIPTION OF THE INVENTION

FIG. 1 illustrates an example of a prior art signal processing system 10. The signal processing system 10 is a companding filter. A companding filter amplifies or attenuates an input signal that is applied to a filter circuit, and attenuates or amplifies the output signal from the circuit. The prior art companding filter 10 includes an input 12, a signal strength detector 14, an input variable gain amplifier 16, a main filter 18, an output variable gain amplifier 20, and an output 22.

The input 12 of the signal processing system 10 is coupled to input 11 of the signal strength detector 14 and an input 30 of a variable gain input amplifier 16. The variable gain input amplifier 16 amplifies or attenuates the signal received by the input 30 depending on a gain control input signal received at a gain control input 13 of the variable gain input amplifier 16 and provides the resulting signal at its output 15. The output 15 of the variable gain input amplifier 16 is coupled to input 17 of a main filter 18. The main filter 18 processes the signal received at its input 17 and produces a processed output signal at its output 19. The output 19 of the main filter 18 is coupled to input 21 of a variable gain output amplifier 20. The variable gain output amplifier 20 amplifies or attenuates the signal received at its input 21 depending on a gain control signal received at a gain control input 23 of the variable gain output amplifier 20 and provides a resulting signal at its output 24. The gain of the variable gain output amplifier 20 is the inverse of the gain of the variable gain input amplifier 16. The output 24 of the variable gain output amplifier 20 is connected to the output 22 of the signal processing system 10.

The signal strength detector 14 measures the strength (e.g., the voltage envelope) of the signal applied to the input 11 of the signal strength detector 14 and provides a gain control signal at its output 25, which is connected to the gain control inputs 13 and 23 of the variable gain input amplifier 16 and the variable gain output amplifier 20, respectively. Depending on the strength of the signal at the input 11 of the signal strength detector 14, different gain control signals are provided at the output 25 of the signal strength detector 14. If the signal applied to the input 12 of the signal processing system 10 is small, the strength detector 11 provides a gain control signal that causes the variable gain input amplifier 16 to have a relatively high gain, thereby causing the signal applied to the input 12 of the signal processing system 10 to be amplified before it is applied to the main filter 18, such that the signal is above the noise floor of the filter 18, i.e., the noise generated by the filter. If the signal applied to the input 12 of the signal processing system 10 is large, the strength deflector 14 provides a gain control signal that causes the variable gain input amplifier 16 to have a relatively low gain, thereby causing the signal applied to the input 12 of the signal processing system 10 to be slightly amplified or even attenuated before it is applied to the main filter 18 to avoid saturating the main filter 18.

FIG. 2 illustrates an exemplary signal processing system 100 in accordance with the present invention. The signal processing system 100 generates a processed signal with a strong in channel component well above the filter noise. The signal processing system 100 includes a system input 102, a main filter 106, a switching unit 130, a comparator 136, a shift register 144, a strength detector 154, a gain control unit 172, and a system output 190.

A signal received by the system input 102 of the signal processing system 100, which typically includes an in-band component and an out-band component, is applied to an input 104 of the main filter 106. In the present embodiment, the main filter 106 is a second order filter, which includes two integrators (not shown in FIG. 2). Preferably, the main filter 106 has enough linear range to accommodate the in-band component and the out-band component of the signal without saturating. Each of the first and second integrators has a variable input gain stage and a variable output gain stage associated with it (not shown in FIG. 2). The main filter 106 processes the signal received at its input 104 as controlled by respective signals received at inputs 108, 110, 112, 114 and 116. These signals control the gain of the variable input gain stage and the variable output gain stage for each of the first and second integrators. The gain of the variable input gain stage and variable output gain stages associated with the first integrator should only be changed when the output of the first integrator is at or near zero. By changing the gain of the variable input gain stage and the variable output gain stage associated with the first integrator when the output of the first integrator is at or near zero, little or no transients are created in the signal produced at the output of the first integrator. Likewise, the gain of the variable input gain stage and the variable output gain stage associated with the second integrator should only be changed when the output of the second integrator is at or near zero. The main filter 106 produces a processed signal at each of its outputs 118, 120 and 122. The signal produced at the output 118 of the main filter 106 is the output of the first integrator of the main filter 106. The output 118 of the main filter 106 is connected to an input 124 of the switching unit 130, and an input 152 of the strength detector 154. The signal produced at the output 120 of the main filter 106 is the output of the second integrator of the main filter 106. The output 120 of the main filter 106 is connected to another input 126 of the switching unit 130. The signal produced at the output 122 of the main filter 106 is the output of the variable gain output stage associated with the first integrator of the main filter 106. The output 122 of the main filter 106 is connected to the system output 190 of the signal processing system 100. The structure and operation of the main filter 106 is described in greater detail hereinbelow with reference to FIG. 3.

The switching unit 130 applies one of the signals received at its inputs 124, 126 to its output 132 in response to a signal received at an input 128. If a logical one voltage level (i.e., 5 V) is received at the input 128, the switching unit 130 connects the input 124 and the output 132, and disconnects the input 120 from the output 132. If a logical zero voltage level (i.e., ground potential) is received at the input 128, the switching unit 130 connects the input 126 to the output 132 and disconnects the input 124 from the output 132. The output 132 is connected to an input 134 of the comparator 136.

The comparator 136 compares a signal received at the input 134 against a reference voltage. If the voltage of the signal received at the input 134 is approximately equal to the reference voltage, the comparator 136 produces a signal equal to a logical one voltage level at an output 138 of the comparator 136. If the voltage of the signal received at the input 134 is not approximately equal to the reference voltage, the comparator 136 produces a signal equal to a logical zero voltage level at the output 138 of the comparator 136. The output 138 of the comparator 136 is connected to a clock input 140 of the shift register 144. In the present embodiment, the reference voltage may be zero.

The shift register 144 determines which of the outputs of the integrators of the main filter 106 the comparator 136 should measure against the reference voltage. A reset/enable input 142 of the shift register 144 is connected to an output 176 of the gain control unit 172. Outputs 146, 148, 150 of the shift register 144 are connected to inputs 166, 168, 170, respectively, of the gain control unit 172. If a logical one voltage level is received at the reset/enable input 142, the shift register 144 provides a logical one voltage level signal at the output 146, a logical zero voltage level signal at the output 148 and a logical zero voltage level signal at the output 150. If a logical zero voltage level signal is received at the reset/enable input 142 and a positive edge (i.e., a logical zero voltage level changing to a logical one voltage level) is received at the input 140, the shift register 144 produces a logical zero voltage level signal on the output 146, produces a signal on the output 148 equal to the signal formerly on the output 146, and produces a signal on the output 150 equal to a logical OR of the signal formerly on the output 148 and the signal formerly on the output 150. The structure and operation of the shift register will be described in greater detail hereinbelow with reference to FIG. 5.

The signal strength detector 154 selects an amplification factor that is the most suitable for processing the signal received by the system input 102 of the signal processing system 100. The input 152 of the signal strength detector 154 is connected to the output 118 of the main filter 106, and outputs 156 and 158 of the signal strength detector 154 are connected to inputs 160 and 162, respectively, of the gain control unit 172. The signal strength detector 154 detects the voltage envelope of a signal received at the input 152 of the signal strength detector 154. A combination of a rectifier and a low-pass filter, well-known for use in many other applications, is one example of a circuit which can be used as an envelope detector of the signal strength detector 154. The signal strength detector 154 determines if the voltage envelope of the signal provided by the output 118 of the main filter 106 is below a first threshold whereby the signal to noise ratio of the output signal of the main filter 106 is approaching a minimum tolerable value with the main filter 106 having the present amplification factors, or exceeds a second threshold whereby the main filter 106 is entering saturation with the present amplification factors.

If the signal strength detector 154 detects that the voltage envelope of the signal received at its input 152 is not below the first threshold or does not exceed the second threshold, the signal strength detector 154 produces a signal equal to a logical zero voltage level on the output 156, and a signal equal to a logical zero voltage level on the output 158. For purposes of the specification and claims, positive logic is assumed. If the signal strength detector 154 detects that the voltage envelope of the signal received at its input 152 falls below the first threshold and does not exceed the second threshold, the signal strength detector 154 produces a logical one voltage level signal on its output 158, and a logical zero voltage level signal on its output 156. If the signal strength detector 154 detects that the voltage envelope of the signal received at its input 152 exceeds the first threshold and exceeds the second threshold, the signal strength detector produces a logical zero voltage level signal on its output 158, and a logical one voltage level signal on its output 156.

The gain control unit 172, responsive to signals received at its inputs 160, 162, 166, 168, 170, provides signals at its output 176 to control the preset/enable input 142 of the shift register 144, and provides signals at its outputs 178, 180, 182, 184, 186 to control the respective amplification factors of the variable gain input stage associated with the first integrator, the variable gain output stage associated with the first integrator, the variable gain input stage associated with the second integrator, and the variable gain output stage associated with the second integrator. The outputs 178, 180, 182, 184, 186 of the gain control unit 172 are connected to the inputs 108, 110, 112, 114, 116, respectively, of the main filter 106. The output 176 of the gain control unit 172 is connected to the preset/enable input 142 of the shift register 144.

The gain control unit 172 provides signals to the main filter 106 and the shift register 144 that allow the amplification factors of the amplifiers within the main filter 106 to vary without causing transients to appear on signals at the system output 190 of the signal processing system 100. The gain control unit 172 begins the process of changing the amplification factors of the amplifiers of the main filter 106 by providing the preset/enable input 142 of the shift register 144 with a logical one voltage level signal to enable the shift register, which in turn provides a logical one voltage level signal to the input 128 of the switching unit 130. Once the comparator 136 senses that the signal received at the input 124 is equal to the reference voltage, the shift register 144 shifts the signals at its outputs 146, 148, 150, and causes a logical zero voltage level signal to be provided to the input 128 of the switching unit. This causes the gain control unit 172 to provide the main filter 106 with appropriate signals on its inputs 108, 110, 112, 114 to change the amplification factors of the variable gain input stage and the variable gain output stage associated with the first integrator, and the variable gain input stage associated with the second integrator of main filter 106 to the desired values. The amplification factor of the variable gain input stage associated with the second integrator must be changed at this point to compensate for the amplification factor change of the variable gain input stage associated with the first integrator. Then, once the comparator 136 senses that the signal received at the input 134 is equal to the reference voltage again, the shift register 144 shifts the signals at its outputs 146, 148, 150, causing the gain control unit 172 to provide the main filter 106 with the appropriate signals on its inputs 112, 114, 116 to change the amplification factors of the variable gain input stage and the variable gain output stage associated with the second integrator.

FIG. 3 illustrates the main filter 106 as shown in FIG. 2. The main filter 106 is a second order filter, and includes two integrators, a first integrator and a second integrator. Each of the integrators is associated with a respective variable gain input stage and a respective variable gain output stage. The variable gain input stage associated with the first integrator consists of resistors 216, 210, 204, 252, switches 232, 224, a capacitor 246, and an operational amplifier 240. The first integrator consists of the operational amplifier 240, the capacitor 246 and the resistor 252. Operational amplifier 240 has a positive input 238. The variable gain output stage associated with the first integrator consists of an operational amplifier 376, resistors 360, 384, 390, 205, and switches 213, 398. Operational amplifier 376 has a positive input 313. The variable gain input stage associated with the second integrator consists of resistors 258, 264, 278, switches 272, 286, a capacitor 334, and an operational amplifier 328. The second integrator consists of the operational amplifier 328, and the capacitor 334. Operational amplifier 328 has a positive input 324. The variable gain output amplification stage associated with the second integrator includes resistors 252, 292, 298, 312, 340, 354, switches 306, 320, operational amplifiers 240, 348, and the capacitor 246. Operational amplifier 348 has a positive input 346. A signal received at the input 104 is applied to a terminal 202 of the resistor 204, a terminal 208 of the resistor 210, and a terminal 214 of the resistor 216; a signal received at the input 108 is applied to a switch control terminal 230 of the switch 232, and a switch control terminal 211 of the switch 213; a signal received at the input 110 is applied to a switch control terminal 222 of the switch 224 and switch control terminal 396 of switch 398; a signal received at the input 112 is applied to a switch control terminal 284 of the switch 286; a signal received at the input 114 is applied to a switch control terminal 304 of the switch 306, and a switch control terminal 270 of the switch 272; and a signal received at the input 116 is applied to a switch control terminal 318 of the switch 320. Switches 224, 232, 213, 398, 320 and 306 may each be implemented as a CMOS transmission gate, in which an NMOS transistor and a PMOS transistor are connected in parallel with each other, the gate of the PMOS transistor is connected to the output of an inverter, the input of the inverter and the gate of the NMOS transistor are connected to each other and serve as the switch control terminal, and the source and drain of each transistor serve as the switch terminals. When a CMOS transmission gate is closed, the NMOS transistor and the PMOS transistor are active, such that a signal received on one terminal of the CMOS transmission gate is conveyed to the other terminal of the CMOS transmission gate. When a CMOS transmission gate is open, the NMOS transistor and the PMOS transistor are not active, such that a signal received on one terminal of the CMOS transmission gate is not conveyed to the other terminal of the CMOS transmission gate.

The variable gain input stage associated with the first integrator may amplify the signal received at the input 104 by one of three amplification factors and produce an output signal at a node 217. If the signals received at the inputs 108 and 110 are a logical zero voltage level (i.e., ground potential) and a logical zero voltage level, respectively, the variable gain input stage amplifies the signal received at the input 104 by a relatively low amplification factor. In the present embodiment, the relatively low amplification factor may be one-tenth. If the signals received at the inputs 108 and 110 are a logical zero voltage level and a logical one voltage level (i.e., 5V), respectively, the variable gain input stage amplifies the signal received at the input 104 by a relatively moderate amplification factor. In the present embodiment, the relatively moderate amplification factor is one. If the signals received at the inputs 108 and 110 are a logical one voltage level and a logical zero voltage level, respectively, the variable gain input stage amplifies the signal received at the input 104 by a relatively high amplification factor. In the present embodiment, the relatively high amplification factor is ten. In the present embodiment, the signals received at the inputs 108 and 110 should never both be a logical one voltage level.

The other terminal 206 of the resistor 204 is coupled to a terminal 226 of the switch 224, a terminal 234 of the switch 232, an inverted input 236 of the operational amplifier 240, a terminal 244 of the capacitor 246, a terminal 250 of the resistor 252, a terminal 290 of the resistor 292, a terminal 296 of the resistor 298 and a terminal 310 of the resistor 312, all of which form a node 217. In the present embodiment, the resistor 204 has a resistance of 200 kΩ.

The other terminal 212 of the resistor 210 is connected to a terminal 220 of the switch 224. In the present embodiment, the resistor 210 has a resistance of 22.22 kΩ. The terminal 226 of the switch 224 is connected to the node 217. The switch 224 closes to connect its terminal 220 to its other terminal 226 if the signal received at the switch control terminal 222 is a logical one voltage level. If the signal at the switch control terminal 222 is at a logical zero voltage level, the switch 224 opens to disconnect its other terminal 220 from its terminal 226 resulting in an open circuit between those terminals.

The other terminal 218 of the resistor 216 is connected to a terminal 228 of the switch 232. In the present embodiment, the resistor 216 has a resistance of 2.02 kΩ. The terminal 234 of the switch 232 is connected to the node 217. The switch 232 closes to connect its terminal 228 to its other terminal 234 if the signal received at its switch control terminal 230 is a logical one voltage level. If the signal at the switch control terminal 230 is a logical zero voltage level, the switch 232 opens to disconnect its terminal 228 from its other terminal 234 resulting in an open circuit between those terminals.

The first integrator filters the signal received at the node 217 and produces a signal at a node 219, which is formed by the common connection of the other terminal 254 of the resistor 252, an output 242 of the operational amplifier 240, the other terminal 248 of the capacitor 246, the terminal 256 of the resistor 258, the terminal 262 of the resistor 264, the terminal 276 of the resistor 278, the terminal 358 of the resistor 360 and the output 118. The other terminal 254 of the resistor 252 is connected to the node 219. In the present embodiment, the resistor 254 has a resistance of 20 kΩ. The other terminal 248 of the capacitor 246 is connected to the node 219. In the present embodiment, the capacitor 246 has a capacitance of 80 pF. In the present embodiment, the operational amplifier 240 is a model LF347 wide bandwidth quad JFET input operational amplifier available from National Semiconductor Corporation of Santa Clara, Calif.

The variable gain output stage associated with the first integrator may amplify the signal received at the node 219 by one of three factors and produce an amplified signal at the output 122. If the signals received at the inputs 108 and 110 are a logical zero voltage level and a logical zero voltage level, respectively, the variable gain output stage amplifies the signal received at the node 219 by a relatively high amplification factor. In the present embodiment, the relatively high amplification factor may be ten. If the signals received at the inputs 108 and 110 are a logical zero voltage level and a logical one voltage level, respectively, the variable gain output stage amplifies the signal received at the node 219 by a relatively moderate amplification factor. In the present embodiment, the relatively moderate amplification factor is one. If the signals received at the inputs 108 and 110 are a logical one and a logical zero voltage level, respectively, the variable output gain stage amplifies the signal received at the node 219 by a relatively low amplification factor. In the present embodiment, the relatively low amplification factor is one-tenth. In the present embodiment, the signals received at the inputs 108 and 110 should never both be a logical one voltage level.

The other terminal 370 of the resistor 360 is connected to an inverted input 374 of the operational amplifier 376, a terminal 382 of the resistor 384, a terminal 388 of the resistor 390, and a terminal 203 of the resistor 205. The common connection of the other terminal 370 of the resistor 360, the inverted input 374 of the operational amplifier 376, the terminal 382 of the resistor 384, the terminal 388 of the resistor 390, and the terminal 203 of the resistor 205 form a node 225. In the present embodiment, the resistor 360 has a resistance of 20 kΩ. In the present embodiment, the operational amplifier 376 is a model LF347 wide bandwidth quad JFET input operational amplifier available from National Semiconductor Corporation of Santa Clara, Calif. The other terminal 386 of the resistor 384 and the output 380 of the operational amplifier 376 are connected to the output 122 of the main filter 106. In the present embodiment, the resistor 384 has a resistance of 200 kΩ.

The other terminal 392 of the resistor 390 is connected to a terminal 394 of the switch 398. In the present embodiment, the resistor 390 has a resistance of 22.22 kΩ. The other terminal 201 of the switch 398 is connected to the output 122 of the main filter 106. The switch 398 closes to connect its terminal 394 to its other terminal 201 if the signal received at the switch control terminal 396 is a logical one voltage level. If the signal at the switch control terminal 396 is a logical zero voltage level, the switch 398 opens to disconnect its terminal 394 from its other terminal 201 resulting in an open circuit between those terminals.

The other terminal 207 of the resistor 205 is connected to a terminal 209 of the switch 213. In the present embodiment, the resistor 205 has a resistance of 2.02 kΩ. The other terminal 215 of the switch 213 is connected to the output 122 of the main filter 106. The switch 213 closes to connect its terminal 209 to its other terminal 215 if the signal received at the switch control terminal 211 is a logical one voltage level. If the signal at the switch control terminal 211 is a logical zero voltage level, the switch 213 opens to disconnect its terminal 209 from its other terminal 215 resulting in an open circuit between those terminals.

The variable gain input stage associated with the second integrator may amplify the signal received at the node 219 by one of three factors and produce an output signal at a node 221, at which the other terminal 288 of the switch 286, the other terminal 274 of the switch 272, the other terminal 260 of resistor 258, one terminal 332 of the capacitor 334 and the inverting input 326 of the operational amplifier 328 are commonly connected. If the signals received at the inputs 112 and 114 are a logical zero voltage level and a logical zero voltage level, respectively, the variable gain input stage amplifies the signal received at the node 221 by a relatively low amplification factor. In the present embodiment, the relatively low factor is one-tenth. If the signals received at the inputs 112 and 114 are a logical zero voltage level and a logical one voltage level, respectively, the variable gain input stage amplifies the signal received at the node 221 by a relatively moderate amplification factor. In the present embodiment, the relatively moderate amplification factor is one. If the signals received at the inputs 112 and 114 are a logical one voltage level and a logical zero voltage level, respectively, the variable gain input stage amplifies the signal received at the node 221 by a relatively high amplification factor. In the present embodiment, the relatively high amplification factor is ten. In the present embodiment, the signals received at the inputs 112 and 114 should never both be a logical one voltage level. The other terminal 260 of the resistor 258 is connected to node 221. In the present embodiment, the resistor 258 has a resistance of 10 kΩ.

The other terminal 266 of the resistor 264 is connected to one terminal 268 of the switch 272. In the present embodiment, the resistor 264 has a resistance of 1.11 kΩ. The other terminal 274 of the switch 272 is connected to the node 221. The switch 272 closes to connect its terminal 268 to its other terminal 274 if the signal received at the switch control terminal 270 is a logical one voltage level. If the signal at the switch control terminal 270 is a logical zero voltage level, the switch 272 opens to disconnect its terminal 268 from its other terminal 274 resulting in an open circuit between those terminals.

The other terminal 280 of the resistor 278 is connected to one terminal 282 of the switch 286. In the present embodiment, the resistor 278 has a resistance of 0.10 kΩ. The other terminal 288 of the switch 286 is connected to the node 221. The switch 286 closes to connect its terminal 282 to its other terminal 288 if the signal received at the switch control terminal 284 is a logical one voltage level. If the signal at the switch control terminal 284 is a logical zero voltage level, the switch 286 opens to disconnect its terminal 282 from its other terminal 288 resulting in an open circuit between those terminals.

The second integrator filters the signal received at the node 221 and produces a filtered signal at the output 120 of the main filter 106. The other terminal 336 of the capacitor 334 is connected to the output 120. In the present embodiment, the capacitor 334 has a capacitance of 80 pF.

The output 330 of the operational amplifier 328 is connected to the output 120 of the main filter 106. In the present embodiment, the operational amplifier 328 may be implemented using a model LF347 wide bandwidth quad JFET input operational amplifier available from National Semiconductor Corporation of Santa Clara, Calif.

The variable gain output stage associated with the second integrator may amplify the signal received at terminal 338 of the resistor 340 by one of three factors and produce an amplified signal at the node 217. If the signals received at the inputs 116 and 114 are a logical zero voltage level and a logical zero voltage level, respectively, the variable gain output stage amplifies the signal received at terminal 338 of the resistor 340 by a relatively low amplification factor. In the present embodiment, the relatively low amplification factor is one-tenth. If the signals received at the inputs 116 and 114 are a logical zero voltage level and a logical one voltage level, respectively, the variable gain output stage amplifies the signal received at terminal 338 of the resistor 340 by a relatively moderate amplification factor. In the present embodiment, the relatively moderate amplification factor is one. If the signals received at the inputs 116 and 114 are a logical one voltage level and a logical zero voltage level, respectively, the variable gain output stage amplifies the signal received at terminal 338 of the resistor 340 by a relatively high amplification factor. In the present embodiment, the relatively high amplification factor is ten. In the present embodiment, the signals received at the inputs 116 and 114 should never both be a logical one voltage level.

The terminal 338 of the resistor 340 is coupled to the output 120. The other terminal 342 of the resistor 340 corresponds with an inverted input 344 of the operational amplifier 348 and the other terminal 352 of the resistor 354. In the present embodiment, the resistor 340 has a resistance of 10 kΩ.

The terminal 356 of the resistor 354 is connected to the node 223, at which the terminal 356 of resistor 354, the output 350 of the operational amplifier 348, the other terminal 294 of the resistor 292, the other terminal 308 of the switch 306 and the other terminal 322 of the switch 320 are commonly connected. In the present embodiment, the resistor 354 has a resistance of 10 kΩ.

The output 350 of the operational amplifier 348 is connected to the node 223. In the present embodiment, the operational amplifier 348 is implemented using the model LF347 wide bandwidth quad JFET input operational amplifier available from National Semiconductor Corporation of Santa Clara, Calif. In the present embodiment, the resistor 292 has a resistance of 10 kΩ.

The other terminal 300 of the resistor 298 is connected to terminal 302 of the switch 306. In the present embodiment, the resistor 298 has a resistance of 1.11 kΩ. The other terminal 308 of the switch 306 is connected to the node 223. The switch 306 closes to connect its terminal 302 to its other terminal 308 if the signal received at the switch control terminal 304 is a logical one voltage level. If the signal at the switch control terminal 304 is a logical zero voltage level, the switch 306 opens to disconnect its terminal 302 from its other terminal 308 resulting in an open circuit between those terminals.

The other terminal 314 of the resistor 312 is connected to a terminal 316 of the switch 320. In the present embodiment, the resistor 312 has a resistance of 0.10 kΩ. The other terminal 322 of the switch 320 is connected to the node 223. The switch 320 closes to connect its terminal 316 to its other terminal 322 if the signal received at the switch control terminal 318 is a logical one voltage level. If the signal at the switch control terminal 318 is a logical zero voltage level, the switch 320 opens to disconnect its terminal 316 from its other terminal 322 resulting in an open circuit between those terminals.

Figure 4:
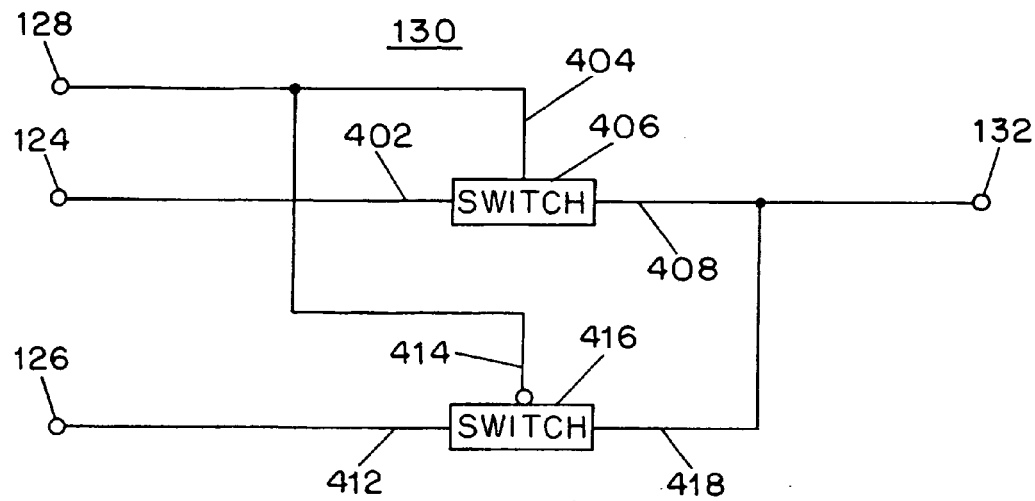
FIG. 4 is a circuit diagram illustrating a switching unit of a signal processing system in accordance with the present invention.

FIG. 4 illustrates an exemplary embodiment of the switching unit 130 as shown in FIG. 2. The switching unit 130 includes an input 124, an input 126, an input 128, a first switch 406, a second switch 416 and an output 132. The switching unit 130 provides one of the signals received at the inputs 124, 126 to the output 132 in response to a signal received at the input 128.

A signal received at the input 124 is applied to one terminal 402 of the first switch 406; a signal received at the input 126 is applied to one terminal 412 of the second switch 416; and a signal received at the input 128 is applied to a switch control terminal 404 of the first switch 406 and an inverting switch control terminal 414 of the second switch 416. The first switch 406 closes to connect its terminal 402 to its other terminal 408 if the signal received at the switch control terminal 404 is a logical one voltage level (i.e., 5 V). If the signal at the switch control terminal 404 is a logical zero voltage level (i.e., ground potential), the first switch 406 opens to disconnect its terminal 402 from its other terminal 408 resulting in an open circuit between those terminals. The other terminal 408 of the first switch 406 is connected to the output 132 of the switching unit 130.

The second switch 416 closes to connect its terminal 412 to its other terminal 418 if the signal received at the inverting switch control terminal 414 is a logical one voltage level. If the signal at the inverting switch control terminal 414 is a logical zero voltage level, the second switch 416 opens to disconnect its terminal 412 from its other terminal 418 resulting in an open circuit between those terminals. The other terminal 418 of the first switch 416 is connected to the output 132 of the switching unit 130.

Figure 10:
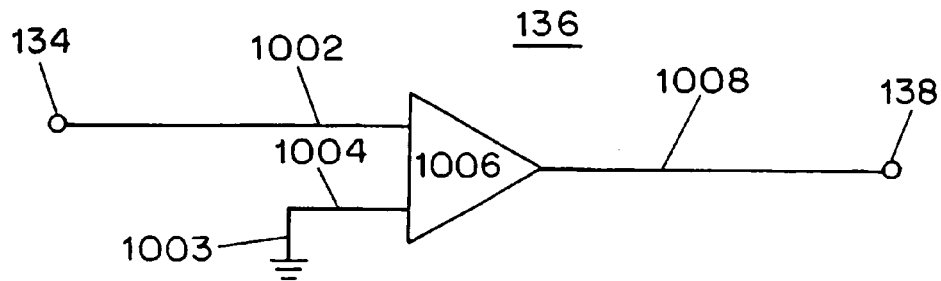
FIG. 10 is a circuit diagram illustrating a comparator of a signal processing system in accordance with the present invention.

FIG. 10 illustrates the comparator 136. The comparator 136 includes an input 134, an output 138, a comparator circuit 1006, and a reference voltage 1003. The comparator circuit 1006 has an input 1002, an input 1004, and an output 1008. In the present embodiment, the comparator 136 may be implemented using a model LM219 high speed dual comparator available from National Semiconductor Corporation of Santa Clara, Calif. The input 1002 is connected to the input 134, the input 1004 is connected to the reference voltage 1003, and the output 1008 is connected to the output 138. In the present embodiment, the reference voltage 1003 is ground. The comparator circuit 1006 measures a signal received at the input 1002 against the reference voltage 1003 received at the input 1004. If the voltage of the signal received at the input 1002 is approximately equal to the reference voltage 1003 received at the input 1004, the comparator circuit 1006 produces a logical one voltage level signal at the output 1008. If the voltage of the signal received at the input 1002 is not approximately equal to the reference voltage 1003, the comparator circuit 1006 produces a logical zero voltage level signal at the output 1008. The output 138 of the comparator 136 is connected to the clock input 140 of the shift register 144.

Figure 5:
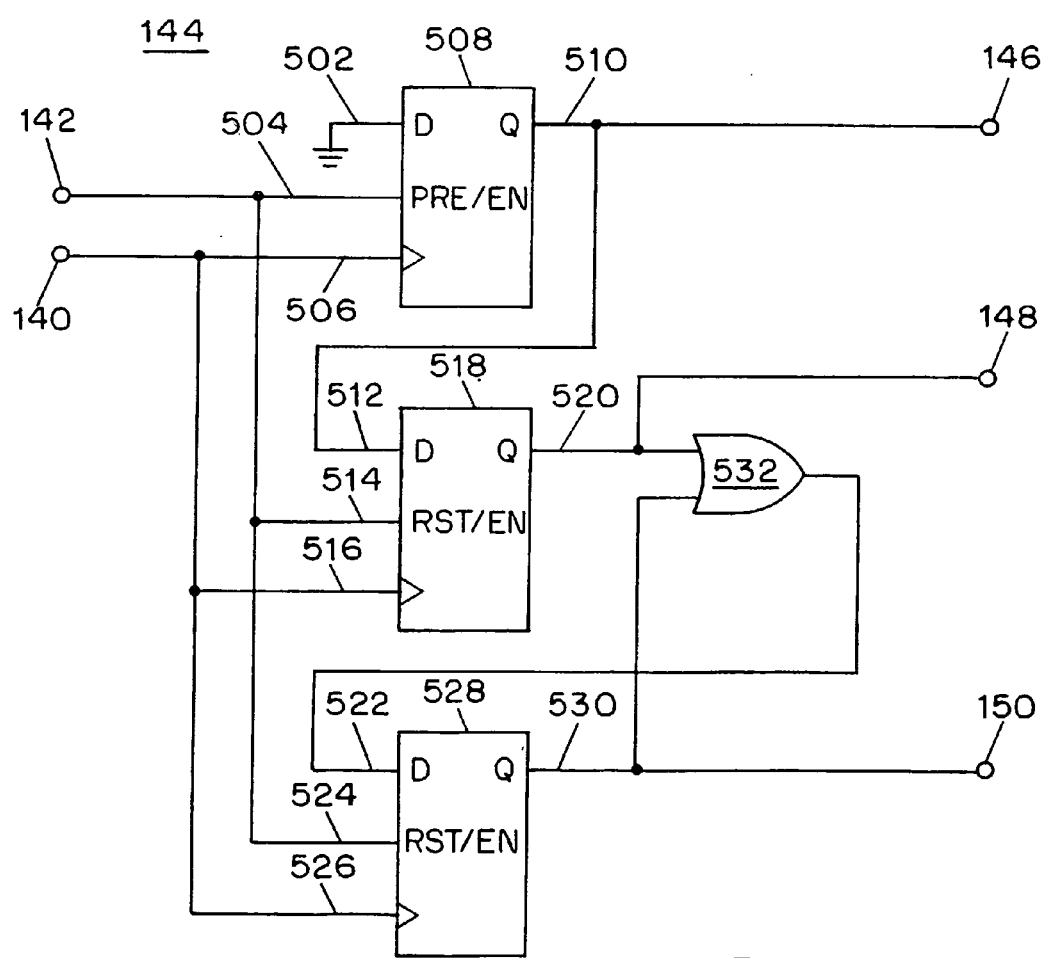
FIG. 5 is a circuit diagram illustrating a shift register usable in a signal processing system in accordance with the present invention.

FIG. 5 illustrates an exemplary embodiment of the shift register 144 as shown in FIG. 2. The shift register 144 includes an clock input 140, an input 142, a first positive edge triggered D-type flip flop 508, a second positive edge triggered D-type flip flop 518, a third positive edge triggered D-type flip flop 528, a two input OR gate 532, an output 146, an output 148 and an output 150. The shift register 144 indicates which of the first and second integrators have reached the reference voltage. A signal received at the clock input 140 is applied to a clock input 506 of the first positive edge triggered D-type flip flop 508, a clock input 516 of the second positive edge triggered D-type flip flop 518, and a clock input 526 of the third positive edge triggered D-type flip flop 528; and a signal received at the input 142 is applied to a preset/enable input 504 of the first positive edge triggered D-type flip flop 508, a reset/enable input 514 of the second positive edge triggered D-type flip flop 518, and a reset/enable input 524 of the third positive edge triggered D-type flip flop 528.

The first positive edge triggered D-type flip flop 508 produces a logical zero voltage level signal (i.e., ground potential) on its data output 510 if a signal received at the preset/enable input 504 is equal to a logical one voltage level (i.e., 5 V). If the signal received at the preset/enable input 504 is equal to a logical zero voltage level, the first positive edge triggered D-type flip flop 508 causes a signal received at its data input 502, which is connected to ground, to be provided at its data output 510 each time a positive transition of a signal from a logical zero voltage level to a logical one voltage level is received by its clock input 506. The output 510 is connected to the data input 512 of the second positive edge triggered D-type flip flop 518, and the output 146.

The second positive edge triggered D-type flip flop 518 produces a logical zero voltage level signal on its data output 520 if a signal received at the reset/enable input 514 is equal to a logical one voltage level. If the signal received at the reset/enable input 514 is equal to a logical zero voltage level, the second positive edge triggered D-type flip flop 518 causes a signal received at its data input 512 to be provided at its data output 520 at each time a positive transition of a signal from a logical zero voltage level to a logical one voltage level is received by its clock input 516. The data input 512 of the second positive edge triggered D-type flip-flop 518 is connected to the data output 510 of the first positive edge triggered D-type flip flop 508 and the output 146 of the shift register 144. The data output 520 is connected to one input of the two input OR gate 532 and the output 148 of the shift register 144.

The third positive edge triggered D-type flip flop 528 produces a logical zero voltage level signal on its data output 530 if a signal received at its reset/enable input 524 is equal to a logical one voltage level. If the signal received at the reset/enable input 524 is equal to a logical zero voltage level, the third positive edge triggered D-type flip flop 528 causes a signal received at its data input 522 to be provided at its data output 530 each time a positive transition of a signal from a logical zero voltage level to a logical one voltage level is received by its clock input 526. The data input 522 of the third positive edge triggered D-type flip-flop 528 is connected to the output of the two input OR gate 532. The data output 530 of the third positive edge triggered D-type flip-flop 528 is connected to the other input of the two input OR gate 532 and the output 150 of the shift register 144 provide more explanation of how the shift register determines which of the outputs of the integrators of the main filter 106 the comparator should measure against the reference voltage.

Figure 6:
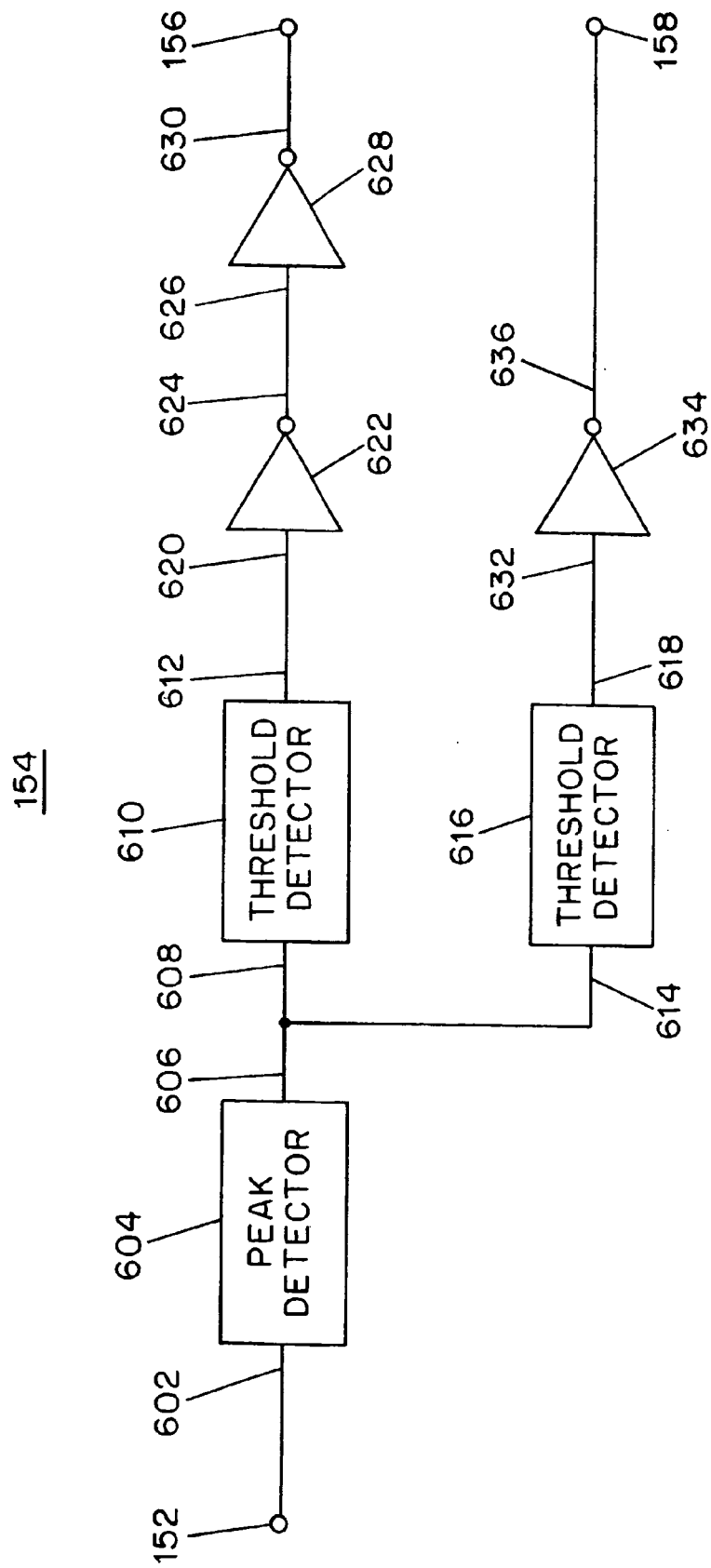
FIG. 6 is a circuit diagram illustrating a strength detector of a signal processing system in accordance with the present invention.

Referring to FIG. 6, there is shown an exemplary embodiment of the strength detector 154 as shown in FIG. 2. The strength detector 154 includes an input 152, a peak detector 604, a first threshold detector 610, a second threshold detector 616, a first inverter gate 622, a second inverter gate 628, a third inverter gate 634, a first output 156, and a second output 158. The peak detector 604 and the first threshold detector 610 are described in more detail below with reference to FIG. 7 and FIG. 8, respectively. The strength detector 154 senses the voltage envelope of the signal received at the input 152, and decides whether it would be appropriate to change amplification factors of the variable gain stages of the main filter 106. The saturation threshold represents the strength of the input signal received by the main filter 106 at which the main filter 106 approaches saturation given the present amplification factors of the main filter 106. The noise floor threshold represents the strength of the input signal received by the main filter 106 at which the output signal of the main filter 106 has a minimum acceptable signal-to-noise ratio given the present amplification factors of the main filter 106.

A signal received at the input 152 of the strength detector 154 is applied to an input 602 of the peak detector 604. The peak detector 604 receives an input voltage signal at its input 602 and provides a current signal representative of the peak of the voltage envelope of the input signal at its output 606. The output 606 of the peak detector 604 is coupled to an input 608 of the first threshold detector 610 and an input 614 of the second threshold detector 616. The first threshold detector 610 provides a logical one voltage level on its output 612 if the signal at its input 608 has a voltage envelope peak greater than the saturation threshold, and provides a logical zero voltage level on its output 612 if the signal at the input 608 has a voltage envelope peak less than the saturation threshold limit. The output 612 of the first threshold detector 610 is coupled to an input 620 of the first inverter gate 622. The second threshold detector 616 provides a logical one voltage level on its output 618 if the signal at its input 614 has a voltage envelope peak greater than the noise floor threshold, and provides a logical zero voltage level on its output 618 if the signal at its input 614 has a voltage envelope peak less than the noise floor threshold. The output 618 of the second threshold detector 616 is coupled to the input 632 of the third inverter gate 634.

The inverter gate 622 inverts the signal received at its input 620 and provides the inverted signal at its output 624. The output 624 is connected to the input 626 of the second inverter gate 628. The second inverter gate 628 inverts the signal received at its input 626 and provides the inverted signal at the output 630. The output 630 is couple to the first output 156 of the strength detector 154. The third inverter gate 634 inverts the signal received at its input 632 and provides the inverted signal at its output 636. The output 636 is connected to the second output 158 of the strength detector 154.

Figure 7:
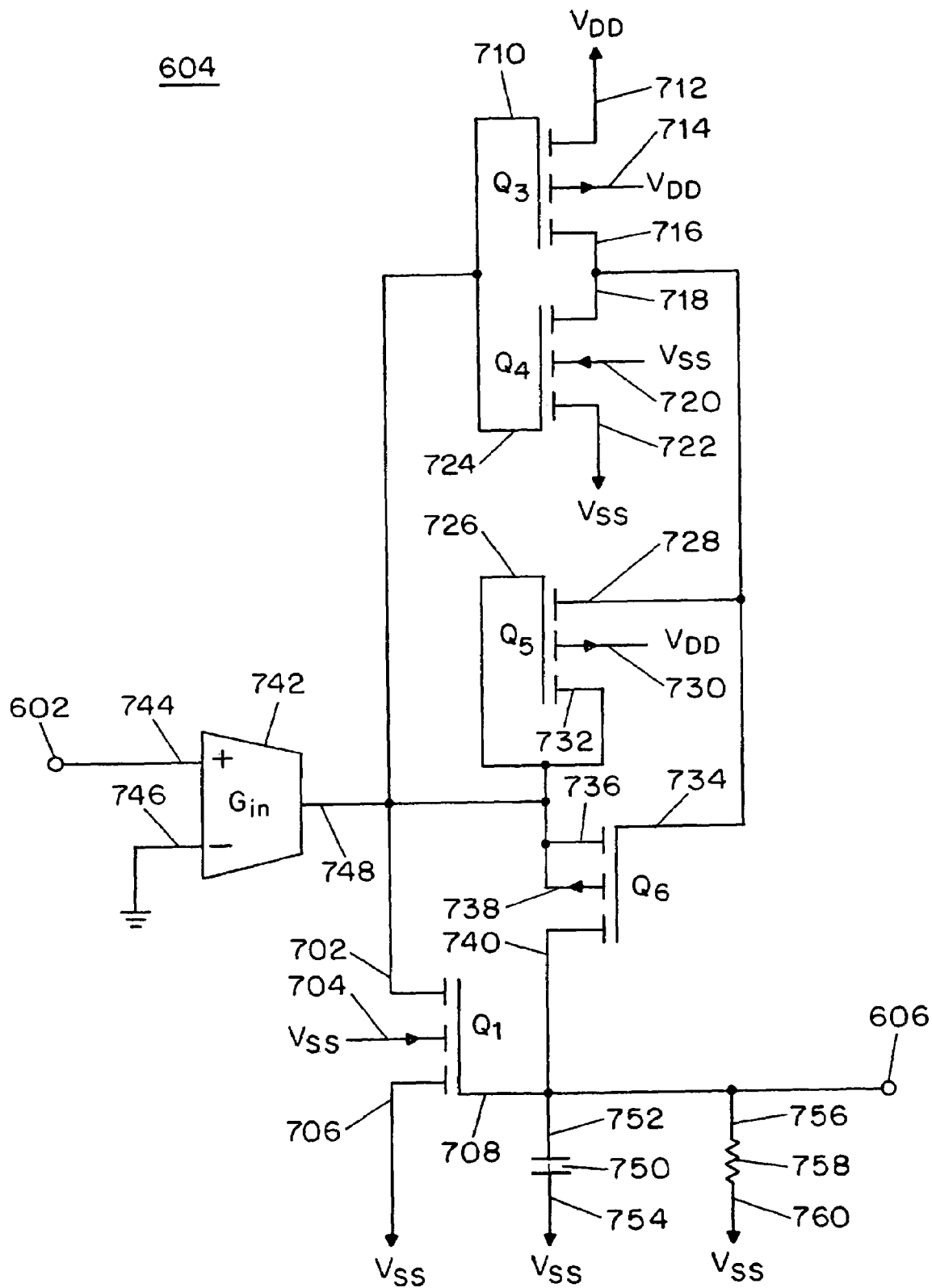
FIG. 7 is a circuit diagram illustrating a peak detector of a signal processing system in accordance with the present invention.

FIG. 7 illustrates an exemplary embodiment of the peak detector 604 of the strength detector 154 of FIG. 6. The peak detector 604 includes an NMOS transistor $Q_1$, a PMOS transistor $Q_3$, an NMOS transistor $Q_4$, a PMOS transistor $Q_5$, a PMOS transistor $Q_6$, a capacitor 750, a resistor 758, and a transconductor 742.

A signal received by the input 602 of the peak detector 604 is applied to a positive input 744 of the transconductor 742. The transconductor 742 provides at its output 748 a signal which is equal to the difference in the signal received by its positive input 744 and the signal received by the negative input 746, which is connected to ground, scaled by a transconductance $G_{in}$ of the transconductor 742. In the present embodiment the transconductor 742 has a transconductance $G_{in}$ of 1 microampere per volt. The current signal provided at the output 748 of the transconductor 742 is applied to the gate 710 of the PMOS transistor $Q_3$ and the gate 724 of the NMOS transistor $Q_4$, which are connected to form an inverter, the gate 726 and the drain 732 of the diode connected PMOS transistor $Q_5$, the drain 736 and the backgate 738 of the PMOS transistor $Q_6$, and the drain 702 of the NMOS transistor $Q_1$. The inverter formed by the PMOS transistor $Q_3$ and the NMOS transistor $Q_4$ are connected between supply voltages $V_{DD}$ and $V_{SS}$, and the commonly connected drains of PMOS transistor $Q_3$ and NMOS transistor $Q_4$ are connected to the source 728 of the diode connected PMOS transistor $Q_5$ and the gate 734 of PMOS transistor $Q_6$. The back gates 714 and 720 of the PMOS transistor $Q_3$ and the NMOS transistor $Q_4$ are connected to supply voltages $V_{DD}$ and $V_{SS}$, respectively. The source terminals 712 and 722 of the PMOS transistor $Q_3$ and the NMOS transistor $Q_4$ are connected to supply voltages $V_{DD}$ and $V_{SS}$ respectively. The commonly connected gate 726 and drain 732 of the diode connected PMOS transistor $Q_5$ are connected to the drain 736 and backgate 738 of PMOS transistor $Q_6$. The back gate 730 of diode connected PMOS transistor is connected to supply voltage $V_{DD}$. The source 740 of the PMOS transistor $Q_6$ is connected to the gate 708 of NMOS transistor $Q_1$, one terminal of capacitor 750, one terminal 756 of the resistor 758 and the output terminal 606 of the peak detector 606. The other terminal 754 of the capacitor 750 and the other terminal 760 of the resistor 758 are connected to supply voltage $V_{SS}$. The drain 702 of NMOS transistor $Q_1$ is connected to the output 748 of the transconductor 742, the drain 736 and the backgate 738 of PMOS transistor $Q_6$, the commonly connected gate 726 and drain 732 of the diode connected PMOS transistor $Q_5$, and the commonly connected gates 710 and 724 of the PMOS transistor $Q_3$ and the NMOS transistor $Q_4$ forming the inverter. The source 706 of the NMOS transistor $Q_1$ is connected to supply voltage $V_{SS}$. The substrate terminal 704 of the NMOS transistor $Q_1$ is connected to supply voltage $V_{ss}$.

The NMOS transistor $Q_1$ of the peak detector 604 forms half of a NMOS current mirror. The other half of the current mirror consists of an NMOS transistor $Q_2$ of the threshold detector 610 (shown in FIG. 8). Thus, when the output 606 of the peak detector 604 is connected to the input 608 of the threshold detector 610, a complete NMOS current mirror is formed which acts as a current memory storing the peak current, i.e., the current that represents the voltage envelope peak of input signal of the main filter. The CMOS inverter formed by PMOS transistor $Q_3$ and NMOS transistor $Q_4$ acts as a current comparator which compares the current provided by the output 748 of the transconductor 742 with the drain current of NMOS transistor $Q_1$.

When the drain current of NMOS transistor $Q_1$ is larger that the current provided by the output 748 of the transconductor 742, the commonly connected gates 710 and 724 of the PMOS transistor $Q_3$ and the NMOS transistor $Q_4$ forming the inverter are at a logical zero voltage level (i.e., $V_{SS}$) and the commonly connected drains 716 and 718 of those transistors are at a logical one voltage level (i.e., $V_{DD}$). Because the gate 734 of PMOS transistor $Q_6$ is connected to the commonly connected drains 716 and 718 of the inverter transistors $Q_3$ and $Q_4$, it is also at the logical one voltage level, and the PMOS transistor $Q_6$ is turned off. If the current provided by the output 748 of the transconductor 742 becomes larger than the drain current of NMOS transistor $Q_1$, the commonly connected gates 710 and 724 of PMOS transistor $Q_3$ and NMOS transistor $Q_4$ switches to a logical one voltage level, and the commonly connected drains 716 and 718 of those transistors switches to a logical zero voltage level; this causes the gate 734 of the PMOS transistor $Q_6$ to go to the logical zero voltage level and the PMOS transistor $Q_6$ to turn on. In this manner, PMOS transistor $Q_6$ connects the gates 708 and 802 (shown in FIG. 8) of NMOS transistors $Q_1$ and $Q_2$, terminal 752 of capacitor 750 and terminal 756 of the resistor 758 to the output 748 of the transconductor 742, and the current mirror follows the current provided by the output 748 of transconductor 742. When the current provided by the output 748 of the transconductor 742 starts to fall below the new peak current, the commonly connected gates 710 and 724 of PMOS transistor $Q_3$ and NMOS transistor $Q_4$ switch back to the logical zero voltage level and the commonly connected drains of those transistors to switch back to a logical one voltage level. This causes the PMOS transistor $Q_6$ to turn off leaving the gates 708 and 802 (shown in FIG. 8) of NMOS transistors at the voltage on the terminal 752 of the capacitor 750, thus allowing the NMOS current mirror to hold the new peak current, though the new peak current degrades as the capacitor 750 discharges through the resistor 758. Thereafter, the diode connected PMOS transistor $Q_5$ starts to supply the difference between the current provided by the output 748 of the transconductor 742 and the drain current of the NMOS transistor $Q_1$ to the node formed by the output 748 of the transconductor 743, the drain of NMOS transistor $Q_1$ and the commonly connected gates 710 and 724 of the PMOS transistor $Q_3$ and the NMOS transistor $Q_4$.

Figure 8:
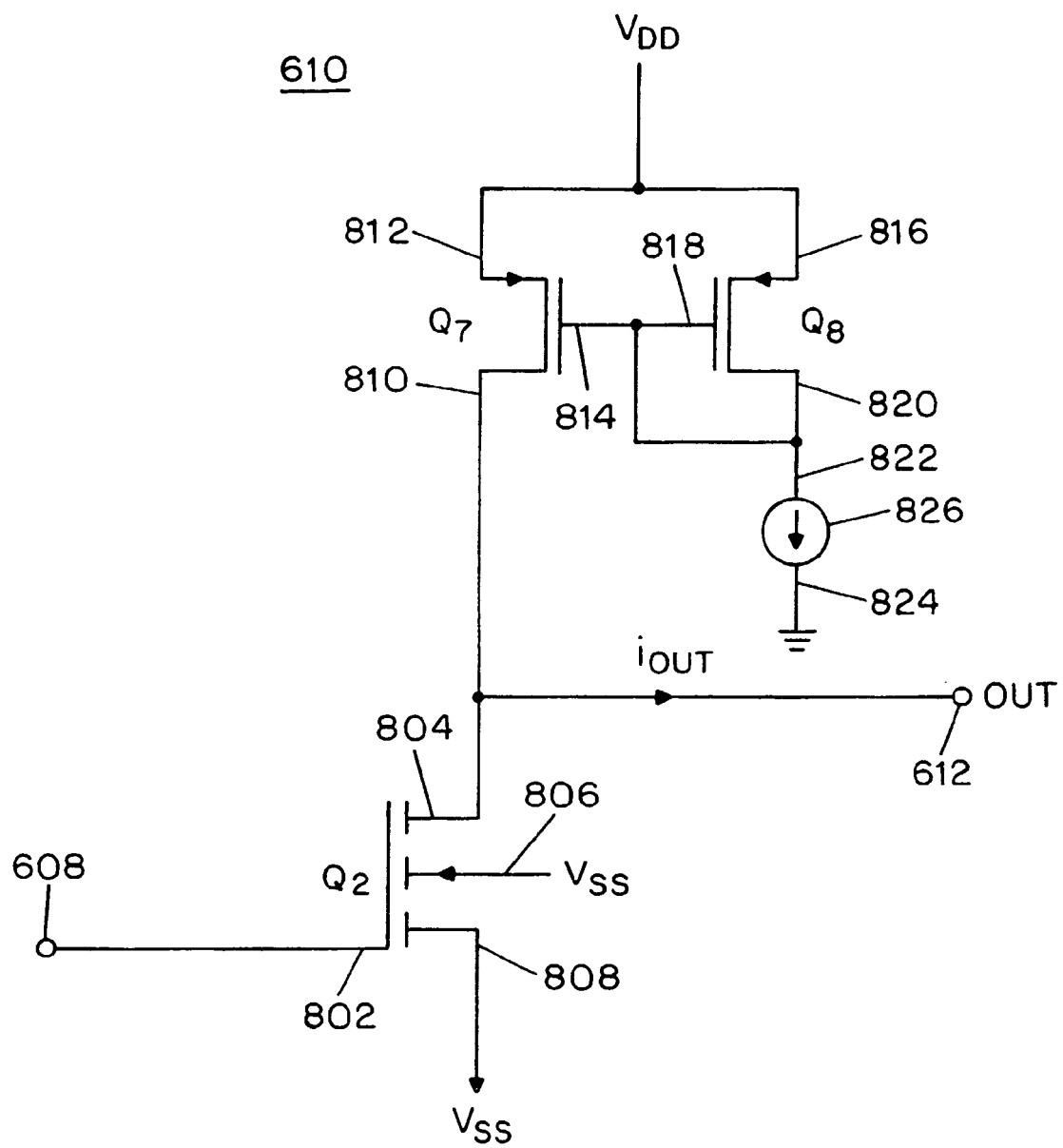
FIG. 8 is a circuit diagram illustrating a threshold detector of a signal processing system in accordance with the present invention.

FIG. 8 illustrates an exemplary embodiment of the first threshold detector 610 of the strength detector 154 of FIG. 6. The first threshold detector 610 compares the current representing of the voltage envelope peak of a signal received at the input 602 of the peak detector 604 to a reference current supplied by a current source 826. The first threshold detector 610 includes an NMOS transistor $Q_2$, a NM0S transistor $Q_7$, a NM0S transistor $Q_8$, the current source 826 and an output 612 of the first threshold detector 610. Any number of threshold detectors can be connected to the peak detector 604 to derive a corresponding number of signal strength detector outputs.

As explained above in connection with FIG. 7, the NMOS transistor $Q_2$ of the first threshold detector 610 forms half of an NMOS current mirror that acts as a current memory which stores the peak current corresponding to the voltage envelope peak of the signal received at the input 602 of the peak detector 604. The other half of the NMOS current mirror that acts as a current memory consists of the NMOS transistor $Q_1$ of the peak detector 604, shown in FIG. 7, which has its gate 708 connected (via the output 606 of the peak detector 604) to the input 608 of the first threshold detector 610. The input 608 is connected to the gate 802 of NMOS transistor $Q_2$ to form a complete NMOS current mirror. The source 808 and the backgate 806 of the NMOS transistor $Q_2$ are connected to supply voltage $V_{SS}$. The drain 804 of the NMOS transistor $Q_2$ is connected to the drain 810 of the NMOS transistor $Q_7$.

The NMOS transistor $Q_7$, the NMOS transistor $Q_8$ and the current source 826 form a current mirror that causes a current to flow through the NMOS transistor $Q_7$ that mirrors the current of the current source 826. The gate 814 of the NMOS transistor $Q_7$ is connected to the gate 818 of the NMOS transistor $Q_8$, the drain 820 of the NMOS transistor $Q_8$, and the positive terminal 822 of the current source 826. The source 812 of the NMOS transistor $Q_7$ and the source 816 of NMOS transistor are connected to supply voltage $V_{DD}$. The drain 810 of the NMOS transistor $Q_7$ is connected to the drain 804 of the NMOS transistor $Q_2$ and the output 612 of the threshold detector 610. The negative terminal 824 of the current source 826 is connected to ground.

The current source 826 produces a reference current that represents the threshold voltage of the first threshold detector 610. The reference current can be any value, for example 100 uA, and the transistors $Q_7$, $Q_8$ of the first threshold detector 610 are scaled to cause the desired current to flow through the transistor $Q_7$. The preferred form of a current source is a resistance connected between the drain 820 of NMOS transistor $Q_8$ and ground. In the present example the reference current generated by the current source in the first threshold detector 610 is 5.5 mA.

The output 612 of the first threshold detector 610 indicates whether the respective amplification factors of the main filter 106 should be decreased given the voltage envelope of the signal received at the input 602 of the peak detector 604. If the current flowing through the transistor $Q_2$, which represents the voltage envelope peak of the signal received at the input 602 of the peak detector 604 (shown in FIG. 7), exceeds the current flowing through the transistor $Q_7$, which is related to the reference current of the current source 826, the output 612 of the first threshold detector 610 will be at a logical zero voltage level. If the current flowing through the transistor $Q_2$ does not exceed the current flowing through the transistor $Q_7$, the output 612 of the first threshold detector 610 will be at a logical one voltage level. In this manner, the saturation threshold limit of the signal strength detector 154 is represented by the amount of current generated by the current source 826.

In an exemplary embodiment the second threshold detector 616 (not shown in FIG. 8) is similar to the first threshold detector 610 shown in FIG. 8. It has a counterpart to NMOS transistor $Q_2$ of the first threshold detector 610, with the gate of the counterpart transistor connected to the output 606 of the peak detector 604. The second threshold detector 616 also has its counterpart to the current mirror, which in the first threshold detector 610 consists of NMOS transistors $Q_7$ and $Q_8$, and reference current source 826. The counterpart to the current source 826 of the second threshold detector 616 would produce a reference current that represents the noise floor threshold limit. In the present example, the counterpart to the current source 826 generates 55 micro-amperes.

Figure 9B:
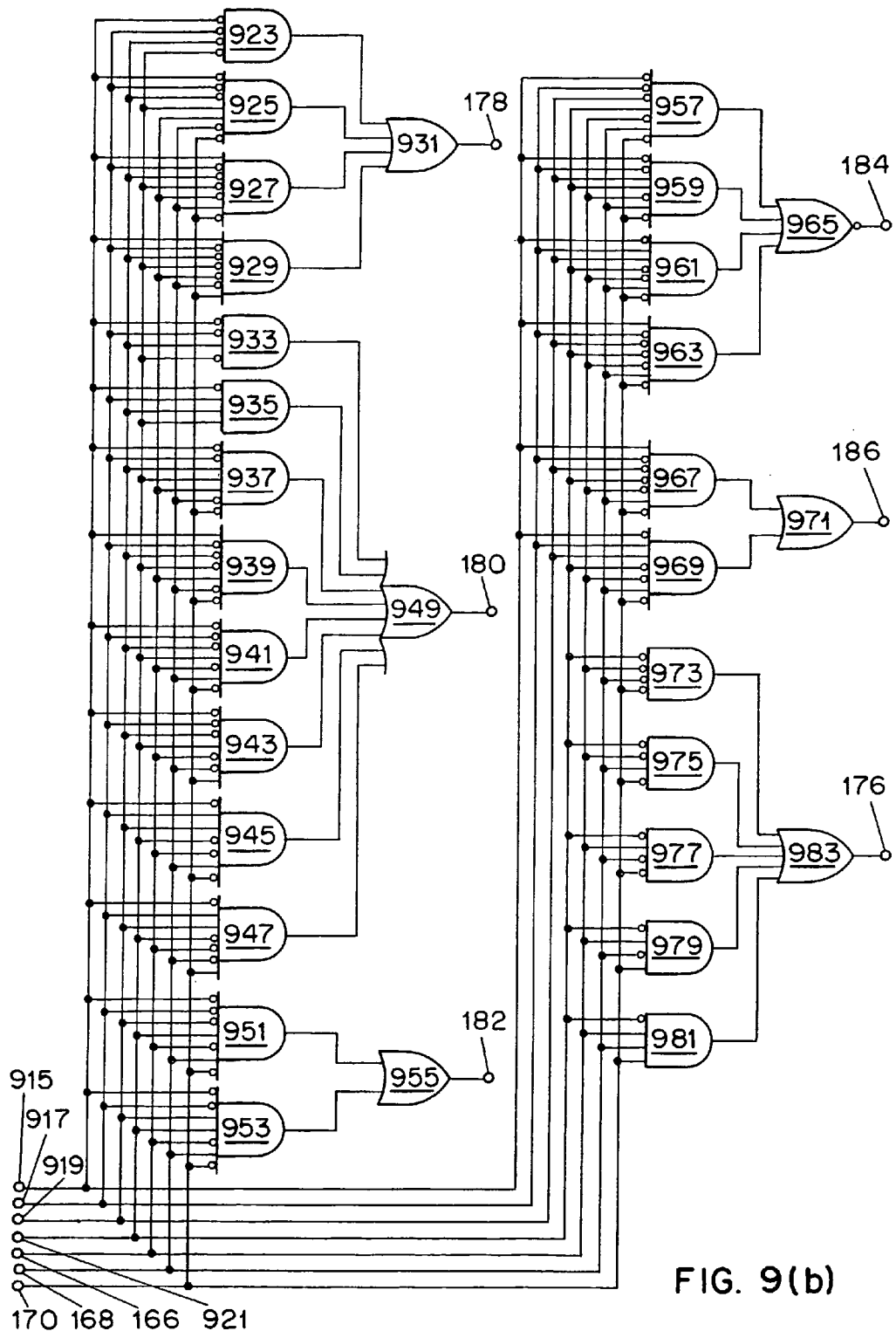
FIGS. 9(*a*) and 9(*b*) are circuit diagrams illustrating a gain control unit of a signal processing system in accordance with the present invention.

FIGS. 9(*a*) and 9(*b*) illustrate an exemplary embodiment of the gain control unit 172. The gain control unit 172 provides signals that control the various variable gain stages of the main filter 106, the switching unit 130, and the shift register 144. The gain control unit 172 includes AND gates, OR gates, a positive edge triggered D-type flip flop 972, a positive edge triggered D-type flip flop 980, a positive edge triggered D-type flip flop 988, a positive edge triggered D-type flip flop 996, and an N-bit binary counter 911. The gain control unit 172 receives control signals at its inputs 160, 162, 166, 168, 170, which are applied to an array of AND gates, and a clock signal at the input 985, which is applied to clock inputs 970, 978, 986, and 994 of the positive edge triggered D-type flip flops 972, 980, 988, and 996, respectively, and clock input 909 of the N-bit counter 911.

When the signal received at the system input 102 changes from a relatively small signal, needing a relatively large amount of amplification to be processed effectively (i.e., without saturation of the main filter 106 or having the main filter 106 provide an output signal having greater than the minimum acceptable signal to noise ratio), to a relatively medium strength signal, needing a relatively moderate amount of amplification to be processed effectively, the gain control unit 172 changes the respective amplification factors of the variable gain stages of the main filter 106 accordingly. If the signal processing system 100 is adapted to process a relatively small input signal, logical one voltage level signals are be produced on the outputs 178 and 184 of the gain control unit 172, and logical zero voltage level signals are produced on outputs 176, 180, 182, and 186 of the gain control unit 172. This corresponds to the application of logical one voltage level signals on inputs 108 and 114 of the main filter 106 of FIG. 3, and the application of logical zero voltage level signals on inputs 110, 112 and 116 of the main filter 106 of FIG. 3. In addition, a logical zero voltage level signal is applied to input 142 of the shift register 144 of FIG. 5. If these conditions exist, and the signal received at the input 162 of the gain control unit 172 is a logical one voltage level signal, the gain control unit 172 changes the respective amplification factors of the variable gain stages of the main filter 106. The logical one voltage level signal at the input 162 of the gain control unit 172 is provided by output 158 of the strength detector 154 to indicate that the main filter 160 is approaching saturation. The gain control unit 172 begins the process of changing the respective amplification factors of variable gain stages of the main filter 106 by providing a logical one voltage level signal on the output 176, without changing any other output signals. Providing a logical one voltage level signal on the output 176 of the gain control unit 172 corresponds to applying a logical one voltage level signal to reset/enable input 142 of the shift register 144, which enables the shift register 144. Once the gain control unit 172 receives a logical one voltage level signal at the input 168, it produces logical one voltage level signals on the outputs 176, 180, 182, and produces logical zero voltage level signals on the outputs 178, 184, 186. The gain control unit 172 receives a logical one voltage level signal at its input 168 when the comparator 136 determines that the output of the first integrator of the main filter 106 (output 118), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "100" state to the "010" state. Changing the respective amplification factors of the variable gain stages of the main filter 106 while the output of the first integrator is approximately equal to zero volts avoids or minimizes the occurrence of transients in the signal produced at the output of the first integrator caused by the change in the amplification factors. Accordingly, once it receives a logical one voltage level signal at its input 168, the gain control unit 172 provides logical one voltage level signals on its outputs 176, 180 and 182 to keep the shift register enabled, and to cause switches 224, 398 and 286 (shown in FIG. 3) to close, and provides logical zero voltage level signals on its outputs 178, 184 and 186 to cause switches 232, 213, 272, 320 and 306 to open. In this manner, the amplification factor of the variable gain input stage associated with the first integrator is changed from a relatively large value to a relatively moderate value, and the amplification factor of the variable gain output stage associated with the first integrator is changed to be the reciprocal of that of the variable gain input stage associated with the first integrator. At the same time, the amplification factor of the variable gain input stage associated with the second integrator is changed from a relatively moderate value to a relatively large value, and the amplification factor of the variable gain output stage associated with the second integrator is changed to be the reciprocal of that of the variable gain input stage associated with the second integrator. And then once the gain control unit 172 receives a logical one voltage level signal at the input 170, the gain control unit 172 produces logical one voltage level signals on the outputs 180, 184, and produces logical zero voltage level signals on the outputs 176, 178, 182, 186. The gain control unit 172 receives a logical one voltage level signal at its input 170 when the comparator 136 determines that the output of the second integrator of the main filter 106 (output 120), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "010" state to the "001" state. Changing the respective amplification factors of the variable gain stages of the main filter 106 while the output of the second integrator is approximately equal to zero volts avoids or minimizes the occurrence of transients in the signal produced at the output of the second integrator caused by the change in the amplification factors. Accordingly, once it receives a logical one voltage level signal at its input 170, the gain control unit 172 provides logical one voltage level signals on its outputs 180 and 184 to cause switches 224, 398, 272 and 306 (shown in FIG. 3) to close, and provides logical zero voltage level signals on its outputs 176, 178, 182 and 186 to cause the shift register 144 to reset and switches 232, 213, 286 and 320 to open. In this manner, the amplification factor of the variable gain input stage associated with the first integrator remains the same, and the amplification factor of the variable gain output stage associated with the first integrator remains the same. At the same time, the amplification factor of the variable gain input stage associated with the second integrator is changed from a relatively large value to a relatively moderate value, and the amplification factor of the variable gain output stage associated with the second integrator is changed to be the reciprocal of that of the variable gain input stage associated with the second integrator. Once this is completed, the gain control unit 172 has completed a desired change of the respective amplification factors of the variable gain stages of the main filter 106.

When the signal received at the system input 102 changes from a relatively medium strength signal, needing a relatively moderate amount of amplification to be processed effectively, to a relatively large signal, needing a relatively small amount of amplification to be processed effectively, the gain control unit 172 changes the respective amplification factors of the variable gain stages of the main filter 106 accordingly. If the signal processing system 100 is adapted to process a relatively medium strength input signal, logical one voltage level signals are produced on the outputs 180 and 184 of the gain control unit 172, and logical zero voltage level signals are produced on outputs 176, 178, 182, and 186 of the gain control unit 172. This corresponds to the application of logical one voltage level signals on inputs 110 and 114 of the main filter 106 of FIG. 3, and the application of logical zero voltage level signals on inputs 108, 112 and 116 of the main filter 106 of FIG. 3. In addition, a logical zero voltage level signal is applied to input 142 of the shift register 144 of FIG. 5. If these conditions exist, and the signal received at the input 162 of the gain control unit 172 is a logical one voltage level signal, and the signal received at the input 160 of the gain control unit 172 is a logical zero voltage level signal, the gain control unit 172 changes the respective amplification factors of the variable gain stages of the main filter 106. The logical one voltage level signal at the input 162 of the gain control unit 172 is provided by output 158 of the strength detector 154 to indicate that the main filter 160 is approaching saturation. The gain control unit 172 begins the process of changing the respective amplification factors of the variable gain stages of the main filter 106 by providing a logical one voltage level signal on the output 176, while all other outputs remain unchanged. Providing a logical one voltage level signal on the output 176 of the gain control unit 172 corresponds to applying a logical one voltage level signal to reset/enable input 142 of the shift register 144, which enables the shift register 144. Once the gain control unit 172 receives a logical one voltage level signal at the input 168, the gain control unit 172 produces logical one voltage level signals on the outputs 176, 182, and produces logical zero voltage level signals on the outputs 178, 180, 184, 186. The gain control unit 172 receives a logical one voltage level signal at its input 168 when the comparator 136 determines that the output of the first integrator of the main filter 106 (output 118), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "100" state to the "010" state. Changing the respective amplification factors of the variable gain stages of the main filter 106 while the output of the first integrator is approximately equal to zero volts avoids or minimizes the occurrence of transients in the signal produced at the output of the first integrator caused by the change in the amplification factors. Accordingly, once it receives a logical one voltage level signal at its input 168, the gain control unit 172 provides logical one voltage level signals on its outputs 176 and 182 to keep the shift register enabled, and to cause the switch 286 (shown in FIG. 3) to close, and provides logical zero voltage level signals on its outputs 178, 180, 184 and 186 to cause switches 232, 213, 224, 398, 272, 306 and 320 to open. In this manner, the amplification factor of the variable gain input stage associated with the first integrator is changed from a relatively moderate value to a relatively small value, and the amplification factor of the variable gain output stage associated with the first integrator is changed to be the reciprocal of that of the variable gain input stage associated with the first integrator. At the same time, the amplification factor of the variable gain input stage associated with the second integrator is changed from a relatively moderate value to a relatively large value, and the amplification factor of the variable gain output stage associated with the second integrator is changed to be the reciprocal of that of the variable gain input stage associated with the second integrator. And then once the gain control unit 172 receives a logical one voltage level signal at the input 170, it produces a logical one voltage level signal on the output 184, and produces logical zero voltage level signals on the outputs 176, 178, 180, 182, 186. The gain control unit 172 receives a logical one voltage level signal at its input 170 when the comparator 136 determines that the output of the second integrator of the main filter 106 (output 120), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "010" state to the "001" state. Changing the respective amplification factors of the variable gain stages of the main filter 106 while the output of the second integrator is approximately equal to zero volts avoids or minimizes the occurrence of transients in the signal produced at the output of the second integrator caused by the change in the amplification factors. Accordingly, once it receives a logical one voltage level signal at its input 170, the gain control unit 172 provides a logical one voltage level signal on its output 184 to cause switches 272 and 306 (shown in FIG. 3) to close, and provides logical zero voltage level signals on its outputs 176, 178, 180, 182 and 186 to cause the shift register 144 to reset and switches 232, 213, 224, 398, 286 and 320 to open. In this manner, the amplification factor of the variable gain input stage associated with the first integrator remains the same, and the amplification factor of the variable gain output stage associated with the first integrator remains the same. At the same time, the amplification factor of the variable gain input stage associated with the second integrator is changed from a relatively large value to a relatively moderate value, and the amplification factor of the variable gain output stage associated with the second integrator is changed to be the reciprocal of that of the variable gain input stage associated with the second integrator. Once this is completed, the gain control unit 172 has completed the desired change of the respective amplification factors of the variable gain stages of the main filter 106.

When the signal received at the system input 102 changes from a relatively large signal, needing a relatively small amount of amplification to be processed effectively, to a relatively medium strength signal, needing a relatively moderate amount of amplification to be processed effectively, the gain control unit 172 changes the respective amplification factors of the variable gain stages of the main filter 106 accordingly. If the signal processing system 100 is adapted to process a relatively large input signal, a logical one voltage level signal is produced on the output 184 of the gain control unit 172, and logical zero voltage level signals will be produced on outputs 176, 178, 180, 182, and 186 of the gain control unit 172. This corresponds to the application of logical one voltage level signals on inputs 114 of the main filter 106 of FIG. 3, and the application of logical zero voltage level signals on inputs 108, 110, 112 and 116 of the main filter 106 of FIG. 3. In addition, a logical zero voltage level signal is applied to input 142 of the shift register 144 of FIG. 5. If these conditions exist, and the signal received at the input 162 of the gain control unit 172 is a logical zero voltage level signal, and the signal received at the input 160 of the gain control unit 172 is a logical one voltage level signal, the gain control unit 172 changes the respective amplification factors of the variable gain stages of the main filter 106. The logical one voltage level signal at the input 160 of the gain control unit 172 is provided by output 156 of the strength detector 154 to indicate that the signal produced by the main filter 160 is approaching the noise floor of the main filter 160. The gain control unit 172 begins the process of changing the respective amplification factors of the variable gain stages of the main filter 106 by waiting a specified period of time equal to the time it would take, given a worst case input signal, for the main filter 106 to recover from a rapid change in the input signal before increasing the respective amplification factors of the variable gain stages of the main filter 106 will not overload any of the internal nodes of the main filter 106. Once the specified period of time has elapsed, the gain control unit 172 provides a logical one voltage level signal on the output 176, while all other outputs remain unchanged. Providing a logical one voltage level signal on the output 176 of the gain control unit 172 corresponds to applying a logical one voltage level signal to reset/enable input 142 of the shift register 144, which enables the shift register 144. Once the gain control unit 172 receives a logical one voltage level signal at the input 168, the gain control unit 172 produces logical one voltage level signals on the outputs 176, 180, 186, and produces logical zero voltage level signals on the outputs 178, 182, 184. The gain control unit 172 receives a logical one voltage level signal at its input 168 when the comparator 136 determines that the output of the first integrator of the main filter 106 (output 118), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "100" state to the "010" state. Changing the respective amplification factors of the variable gain stages of the main filter 106 while the output of the first integrator is approximately equal to zero volts avoids or minimizes the occurrence of transients in the signal produced at the output of the first integrator caused by the change in the amplification factors. Accordingly, once it receives a logical one voltage level signal at its input 168, the gain control unit 172 provides logical one voltage level signals on its outputs 176, 180 and 186 to keep the shift register enabled, and to cause switches 224, 398 and 320 (shown in FIG. 3) to close, and provides logical zero voltage level signals on its outputs 178, 182 and 184 to cause switches 232, 213, 286, 272 and 306 to open. In this manner, the amplification factor of the variable gain input stage associated with the first integrator is changed from a relatively small value to a relatively moderate value, and the amplification factor of the variable gain output stage associated with the first integrator is changed to be the reciprocal of that of the variable gain input stage associated with the first integrator. At the same time, the amplification factor of the variable gain input stage associated with the second integrator is changed from a relatively moderate value to a relatively small value, and the amplification factor of the variable gain output stage associated with the second integrator is changed to be the reciprocal of that of the variable gain input stage associated with the second integrator. And then once the gain control unit 172 receives a logical one voltage level signal at the input 170, it produces logical one voltage level signals on the outputs 180, 184, and produces logical zero voltage level signals on the outputs 176, 178, 182, 186. The gain control unit 172 receives a logical one voltage level signal at its input 170 when the comparator 136 determines that the output of the second integrator of the main filter 106 (output 120), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "010" state to the "001" state. Changing the respective amplification factors of the variable gain stages of the main filter 106 while the output of the second integrator is approximately equal to zero volts avoids or minimizes the occurrence of transients in the signal produced at the output of the second integrator caused by the change in the amplification factors. Accordingly, once it receives a logical one voltage level signal at its input 170, the gain control unit 172 provides logical one voltage level signals on its outputs 180 and 184 to cause switches 224, 398, 272 and 306 (shown in FIG. 3) to close, and provides logical zero voltage level signals on its outputs 176, 178, 182 and 186 to cause the shift register 144 to reset and switches 232, 213, 286 and 320 to open. In this manner, the amplification factor of the variable gain input stage associated with the first integrator remains the same, and the amplification factor of the variable gain output stage associated with the first integrator remains the same. At the same time, the amplification factor of the variable gain input stage associated with the second integrator is changed from a relatively small value to a relatively moderate value, and the amplification factor of the variable gain output stage associated with the second integrator is changed to be the reciprocal of that of the variable gain input stage associated with the second integrator. Once this is completed, the gain control unit 172 has completed the desired change of the respective amplification factors of the variable gain stages of the main filter 106.

When the signal received at the system input 102 changes from a relatively medium strength signal, needing a relatively moderate amount of amplification to be processed effectively, to a relatively small signal, needing a relatively large amount of amplification to be processed effectively, the gain control unit 172 changes the respective amplification factors of the variable gain stages of the main filter 106 accordingly. If the signal processing system 100 is adapted to process a relatively medium strength input signal, logical one voltage level signals are produced on the outputs 180, 184 of the gain control unit 172, and logical zero voltage level signals are produced on outputs 176, 178, 182, and 186 of the gain control unit 172. This corresponds to the application of logical one voltage level signals on inputs 110 and 114 of the main filter 106 of FIG. 3, and the application of logical zero voltage level signals on inputs 108, 112 and 116 of the main filter 106 of FIG. 3. In addition, a logical zero voltage level signal is applied to input 142 of the shift register 144 of FIG. 5. If these conditions exist, and the signal received at the input 162 of the gain control unit. 172 is a logical zero voltage level signal, and the signal received at the input 160 of the gain control unit 172 is a logical one voltage level signal, the gain control unit 172 changes the respective amplification factors of the variable gain stages of the main filter 106. The logical one voltage level signal at the input 160 of the gain control unit 172 is provided by output 156 of the strength detector 154 to indicate that the signal produced by the main filter 160 is approaching the noise floor of the main filter 160. The gain control unit 172 begins the process of changing the respective amplification factors of the variable gain stages of the main filter 106 by waiting a specified period of time equal to the time it would take, given a worst case rapidly changing input signal, for the main filter 106 to recover from a rapid change in the input signal before increasing the respective amplification factors of the variable gain stages of the main filter 106 will not overload any of the internal nodes of the main filter 106. Once the specified period of time has elapsed, the gain control unit 172 provides a logical one voltage level signal on the output 176, while all other outputs remain unchanged. Providing a logical one voltage level signal on the output 176 of the gain control unit 172 corresponds to applying a logical one voltage level signal to reset/enable input 142 of the shift register 144, which enables the shift register 144. Once the gain control unit 172 receives a logical one voltage level signal at the input 168, it produces logical one voltage level signals on the outputs 176, 178, 186, and produces logical zero voltage level signals on the outputs 180, 182, 184. The gain control unit 172 receives a logical one voltage level signal at its input 168 when the comparator 136 determines that the output of the first integrator of the main filter 106 (output 118), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "100" state to the "010" state. Changing the respective amplification factors of the variable gain stages of the main filter 106 while the output of the first integrator is approximately equal to zero volts avoids or minimizes the occurrence of transients in the signal produced at the output of the first integrator caused by the change in the amplification factors. Accordingly, once it receives a logical one voltage level signal at its input 168, the gain control unit 172 provides logical one voltage level signals on its outputs 176, 178 and 186 to keep the shift register enabled, and to cause switches 232, 213 and 320 (shown in FIG. 3) to close, and provides logical zero voltage level signals on its outputs 180, 182 and 184 to cause switches 224, 398, 286, 272 and 306 to open. In this manner, the amplification factor of the variable gain input stage associated with the first integrator is changed from a relatively moderate value to a relatively large value, and the amplification factor of the variable gain output stage associated with the first integrator is changed to be the reciprocal of that of the variable gain input stage associated with the first integrator. At the same time, the amplification factor of the variable gain input stage associated with the second integrator is changed from a relatively moderate value to a relatively small value, and the amplification factor of the variable gain output stage associated with the second integrator is changed to be the reciprocal of that of the variable gain input stage associated with the second integrator. And then once the gain control unit 172 receives a logical one voltage level signal at the input 170, the gain control unit 172 produces logical one voltage level signals on the output 178, 184, and produces logical zero voltage level signals on the outputs 176, 180, 182, 186. The gain control unit 172 receives a logical one voltage level signal at its input 170 when the comparator 136 determines that the output of the second integrator of the main filter 106 (output 120), as provided to the comparator 136 by the switching unit 130, is approximately equal to zero volts, and the comparator 136 provides a logical zero to logical one voltage level transition at its output 138 to the clock input 140 of the shift register 144 causing the shift register 144 to change from the "010" state to the "001" state. Changing the respective amplification factors of the variable gain stages of the main filter 106 while the output of the second integrator is approximately equal to zero volts avoids or minimizes the occurrence of transients in the signal produced at the output of the second integrator caused by the change in the amplification factors. Accordingly, once it receives a logical one voltage level signal at its input 170, the gain control unit 172 provides logical one voltage level signals on its outputs 178 and 184 to cause switches 232, 213, 272 and 306 (shown in FIG. 3) to close, and provides logical zero voltage level signals on its outputs 176, 180, 182 and 186 to cause the shift register 144 to reset and switches 224, 398, 286 and 320 to open. In this manner, the amplification factor of the variable gain input stage associated with the first integrator remains the same, and the amplification factor of the variable gain output stage associated with the first integrator remains the same. At the same time, the amplification factor of the variable gain input stage associated with the second integrator is changed from a relatively small value to a relatively moderate value, and the amplification factor of the variable gain output stage associated with the second integrator is changed to be the reciprocal of that of the variable gain input stage associated with the second integrator. Once this is completed, the gain control unit 172 has completed the desired change of the respective amplification factors of the variable gain stages of the main filter 106.

The N-bit counter 911 receives a signal at an enable/reset input 907, and a signal at a clock input 909, and provides an output at a counter overflow output 913. If the signal received at the input 907 is a logical one voltage level signal, the N-bit counter 911 increments on the positive edge (i.e., a transition from a logical zero voltage level to a logical one voltage level) of each clock cycle, and the signal produced at the counter overflow output 913 is a logical zero, until the N-bit counter 911 reaches a specified maximum value. On the clock cycle after the N-bit counter 911 reaches its specified maximum value, the signal produced at the counter overflow output 913 is a logical one voltage level signal. If the signal received at the input 907 is a logical zero voltage level signal, the N-bit counter 911 is reset to a predetermined state, and the signal produced at the counter overflow output 913 is a logical zero voltage level signal. In a certain embodiment, the predetermined state is selected such that once the signal received at the enable/reset input 907 changes from a logical zero voltage level signal to a logical one voltage level signal, the counter overflow output 913 will not change to a logical one voltage level signal until a time equal to the time it would take, given a worst case rapidly changing input signal, for the main filter 106 to recover from a rapid change in the input signal before increasing the respective amplification factors of the variable gain stages of the main filter 106 will not overload any of the internal nodes of the main filter 106.

A five input AND gate 902 receives the inverse of a signal from a data output 974 of the positive edge triggered D-type flip flop 972, a signal from a data output 982 of the positive edge triggered D-type flip flop 980, a signal from a data output 990 of the positive edge triggered D-type flip flop 988, a signal from a data output 998 of the positive edge triggered D-type flip flop 996, and a signal received from the counter overflow output 913. The output of the AND gate 902 is connected to one input of a two input OR gate 906. A five input AND gate 904 receives a signal from the data output 974 of the positive edge triggered D-type flip flop 972, the inverse of a signal from the data output 982 of the positive edge triggered D-type flip flop 980, the inverse of a signal from the data output 990 of the positive edge triggered D-type flip flop 988, the inverse of a signal from the data output 998 of the positive edge triggered D-type flip flop 996, and the inverse of a signal received from the counter overflow output 913. The output of the AND gate 904 is connected to the other input of a two input OR gate 906. The output of the two input OR gate 906 is connected to the data input 968 of the positive edge triggered D-type flip flop 972.

A six input AND gate 908 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, the inverse of a signal received by the input 162, and a signal received by the input 160. The AND gate 908 provides its output to a first input of a nine input OR gate 926. A five input AND gate 910 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, a signal from the data output 998 of the positive edge triggered D-type flip flop 996, and a signal received by the input 170. The output of the AND gate 908 is provided to a second input of the nine input OR gate 926. A five input AND gate 912 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, the inverse of a signal from the data output 998 of the positive edge triggered D-type flip flop 996, and the inverse of a signal received by the input 160. The output of the AND gate 914 is provided to a fourth input of the nine input OR gate 926. A five input AND gate 914 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, the inverse of a signal from the data output 998 of the positive edge triggered D-type flip flop 996, and a signal received by the input 160. The output of the AND gate 914 is provided to a fourth input of the nine input OR gate 926. A five input AND gate 916 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and the inverse of a signal received from the overflow output 913 of the counter 911. The output of the AND gate 916 is provided to a fifth input of the nine input OR gate 926. A five input AND gate 918 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and a signal received from the overflow output 913 of the counter 911. The AND gate 918 is provided to a sixth input of the nine input OR gate 926. A five input AND gate 920 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, and the inverse of a signal received by the input 170. The output of the AND gate 920 is provided to a seventh input of the nine input OR gate 926. A five input AND gate 922 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, and a signal received by the input 170. The output of the AND gate 922 is provided to an eighth input of the nine input OR gate 926. A five input AND gate 924 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, a signal from the data output 998 of the positive edge triggered D-type flip flop 996, and the inverse of a signal received from the overflow output 913 of the counter 911. The output of AND gate 924 is provided to the ninth input of the nine input OR gate 926. The output of the nine input OR gate 926 is provided to a data input 976 of the positive edge triggered D-type flip flop 980.

A five input AND gate 928 receives the inverse of a signal from the data output 974 of the positive edge triggered D-type flip flop 972, the inverse of a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and a signal received by the input 170. The output of the AND gate 928 is provided to a first input of a nine input OR gate 946. A six input AND gate 930 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, the inverse of a signal received by the input 160, and the inverse of a signal received by the input 162. The output of the AND gate 930 is provided to a second input of the nine input OR gate 946. A six input AND gate 932 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, a signal received by the input 160, and the inverse of a signal received by the input 162. The output of the AND gate 932 is provided to a third input of the nine input OR gate 946. A six input AND gate 934 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, a signal received by the input 160, and the inverse of a signal received by the input 162. The output of the AND gate 934 is provided to a fourth input of the nine input OR gate 946. A five input AND gate 936 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, a signal from the data output 998 of the positive edge triggered D-type flip flop 996, and the inverse of a signal received by the input 170. The output of the AND gate 936 is provided to a fifth input of the nine input OR gate 946. A five input AND gate 938 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and a signal from the overflow output 913 of the counter 911. The output of the AND gate 938 is provided to a sixth input of the nine input OR gate 946. A five input AND gate 940 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, and the inverse of a signal received by the input 170. The output of the AND gate 940 is provided to a seventh input of the nine input OR gate 946. A five input AND gate 942 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, and a signal received by the input 170. The output of the AND gate 942 is provided to an eighth input of the nine input OR gate 946. A five input AND gate 944 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, a signal from the data output 998 of the positive edge triggered D-type flip flop 996, and the inverse of a signal from the overflow output 913 of the counter 911. The output of the AND gate 944 is provided to a ninth input of the nine input OR gate 946. The output of the nine input OR gate 946 is provided to a data input 984 of the positive edge triggered D-type flip flop 988.

A five input AND gate 948 receives the inverse of a signal from the data output 974 of the positive edge triggered D-type flip flop 972, the inverse of a signal from the data output 982 of the positive edge triggered D-type flip flop 980, the inverse of a signal from the data output 990 of the positive edge triggered D-type flip flop 988, the inverse of a signal from the data output 998 of the positive edge triggered D-type flip flop 996, and a signal received by the input 162. The output of the AND gate 948 is provided to a first input of a nine input OR gate 966. A five input AND gate 950 receives the inverse of a signal from the data output 974 of the positive edge triggered D-type flip flop 972, the inverse of a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and the inverse of a signal received by the input 170. The output of the AND gate 950 is provided to a second input of the nine input OR gate 966. A six input AND gate 952 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, a signal received by the input 162, and the inverse of a signal received by the input 160. The output of the AND gate 952 is provided to a third input of the nine input OR gate 966. A six input AND gate 954 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, the inverse of a signal received by the input 162, and a signal received by the input 160. The output of the AND gate 954 is provided to a fourth input of the nine input OR gate 966. A five input AND gate 956 receives the inverse of a signal from the data output 974 of the positive edge triggered D-type flip flop 972, the inverse of a signal from the data output 982 of the positive edge triggered D-type flip flop 980, a signal from the data output 990 of the positive edge triggered D-type flip flop 988, a signal from the data output 998 of the positive edge triggered D-type flip flop 996, and the inverse of a signal received by the input 170. The output of the AND gate 956 is provided to a fifth input of the nine input OR gate 966. A five input AND gate 958 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, the inverse of a signal from the data output 998 of the positive edge triggered D-type flip flop 996, and a signal received by the input 160. The output of the AND gate 958 is provided to a sixth input of the nine input OR gate 966. A five input AND gate 960 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, a signal from the data output 998 of the positive edge triggered D-type flip flop 996, and the inverse of a signal received from the overflow output 913 of the counter 911. The output of the AND gate 960 is provided to a seventh input of the nine input OR gate 966. A five input AND gate 962 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, the inverse of a signal from the data output 998 of the positive edge triggered D-type flip flop 996, and a signal received by the input 170. The output of the AND gate 962 if provided to an eighth input of the nine input OR gate 966. A five input AND gate 964 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, a signal from the data output 998 of the positive edge triggered D-type flip flop 996, and the inverse of a signal received from the overflow output 913 of the counter 911. The output of the AND gate 964 is provided to a ninth input of the nine input OR gate 966. The output of the nine input OR gate 966 is provided to a data input 992 of the positive edge triggered D-type flip flop 996.

The first D-type flip-flop 972 holds the most significant bit of the current state of the gain control unit 172 until the next positive edge of the clock signal is received at the clock input 985 of the gain control unit 172, at which time the most significant bit of the current state is provided at the data output 974 of the first D-type flip-flop 972. The output 974 is coupled to a terminal 915. The second D-type flip-flop 980 holds the second most significant bit of the current state of the gain control unit 172 until the next positive edge of the clock signal is received at the clock input 985 of the gain control unit 172, at which time the second most significant bit of the current state is provided at the data output 982 of the second D-type flip-flop 980. The output 982 is coupled to a terminal 917. The third D-type flip-flop 988 holds the third most significant bit of the current state of the gain control unit 172 until the next positive edge of the clock signal is received at the clock input 985 of the gain control unit 172, at which time the third most significant bit of the current state is provided at the data output 990 of the third D-type flip-flop 988. The output 990 is coupled to a terminal 919. The fourth D-type flip-flop 996 holds the least significant bit of the current state of the gain control unit 172 until the next positive edge of the clock signal is received at the clock input 985 of the gain control unit 172, at which time the least significant bit of the current state is provided at the data output 998 of the fourth D-type flip-flop 996. The output 998 is coupled to a terminal 921.

A four input AND gate 901 receives the inverse of a signal from the data output 974 of the positive edge triggered D-type flip flop 972, a signal from the data output 982 of the positive edge triggered D-type flip flop 980, the inverse of a signal from the data output 990 of the positive edge triggered D-type flip flop 988, and a signal from the data output 998 of the positive edge triggered D-type flip flop 996. The output of the AND gate 901 is provided to one input of a two input OR gate 905. A four input AND gate 903 receives the inverse of a signal from the data output 974 of the positive edge triggered D-type flip flop 972, a signal from the data output 982 of the positive edge triggered D-type flip flop 980, a signal from the data output 990 of the positive edge triggered D-type flip flop 988, and a signal from the data output 998 of the positive edge triggered D-type flip flop 996. The output of the AND gate 903 is provided to the other input of the two input OR gate 905. The output of the two input OR gate 905 is provided to the enable/reset input 907 of the N-bit counter 911.

A four input AND gate 923 receives the inverse of a signal received by the input 915, the inverse of a signal received by the input 917, the inverse of a signal received by the input 919, and the inverse of a signal received by the input 921. The output of the AND gate 923 is provided to a first input of a four input OR gate 931. A seven input AND gate 925 receives the inverse of a signal received by the input 915, the inverse of a signal received by the input 917, the inverse of a signal received by the input 919, a signal received by the input 921, a signal received by the input 166, the inverse of a signal received by the input 168, and the inverse of a signal received by the input 170. The output of the AND gate 925 is provided to a second input of the four input OR gate 931. A seven input AND gate 927 receives a signal received by the input 915, the inverse of a signal received by the input 917, the inverse of a signal received by the input 919, the inverse of a signal received by the input 921, the inverse of a signal received by the input 166, a signal received by the input 168, and the inverse of a signal received by the input 170. The output of the AND gate 927 is provided to a third input of the four input OR gate 931. A seven input AND gate 929 receives a signal received by the input 915, the inverse of a signal received by the input 917, the inverse of a signal received by the input 919, the inverse of a signal received by the input 921, the inverse of a signal received by the input 166, the inverse of a signal received by the input 168, and a signal received by the input 170. The output of the AND gate 926 is provided to a fourth input of the four input OR gate 931. The output of the four input OR gate 931 is provided to the output 178.

A four input AND gate 933 receives the inverse of a signal received by the input 915, the inverse of a signal received by the input 917, a signal received by the input 919, and the inverse of a signal received by the input 921. The output of the AND gate 933 is provided to a first input of an eight input OR gate 949. A four input AND gate 935 receives the inverse of a signal received by the input 915, a signal received by the input 917, a signal received by the input 919, and a signal received by the input 921. The output of the AND gate 935 is provided to a second input of the eight input OR gate 949. A seven input AND gate 937 receives the inverse of a signal received by the input 915, the inverse of a signal received by the input 917, a signal received by the input 919, a signal received by the input 921, a signal received by the input 166, the inverse of a signal received by the input 168, and the inverse of a signal received by the input 170. The output of the AND gate 937 is provided to a third input of the eight input OR gate 949. A seven input AND gate 939 receives a signal received by the input 915, the inverse of a signal received by the input 917, the inverse of a signal received by the input 919, the inverse of a signal received by the input 921, a signal received by the input 166, the inverse of a signal received by the input 168, and the inverse of a signal received by the input 170. The output of the AND gate 939 is provided to a fourth input of the eight input OR gate 949. A seven input AND gate 941 receives the inverse of a signal received by the input 915, the inverse of a signal received by the input 917, the inverse of a signal received by the input 919, a signal received by the input 921, the inverse of a signal received by the input 166, a signal received by the input 168, and the inverse of a signal received by the input 170. The output of the AND gate 941 is provided to a fifth input of the eight input OR gate 949. A seven input AND gate 943 receives the inverse of a signal received by the input 915, the inverse of a signal received by the input 917, the inverse of a signal received by the input 919, a signal received by the input 921, the inverse of a signal received by the input 166, the inverse of a signal received by the input 168, and a signal received by the input 170. The output of the AND gate 943 is provided to a sixth input of the eight input OR gate 949. A seven input AND gate 945 receives the inverse of a signal received by the input 915, a signal received by the input 917, a signal received by the input 919, the inverse of a signal received by the input 921, the inverse of a signal received by the input 166, a signal received by the input 168, and the inverse of a signal received by the input 170. The output of the AND gate 945 is provided to a seventh input of the eight input OR gate 949. A seven input AND gate 947 receives the inverse of a signal received by the input 915, a signal received by the input 917, a signal received by the input 919, the inverse of a signal received by the input 921, the inverse of a signal received by the input 166, the inverse of a signal received by the input 168, and a signal received by the input 170. The output of the AND gate 947 is provided to an eighth input of the eight input OR gate 949. The output of the eight input OR gate 949 is provided to the output 180 of the gain control unit 172.

A seven input AND gate 951 receives the inverse of a signal received by the input 915, the inverse of a signal received by the input 917, the inverse of a signal received by the input 919, a signal received by the input 921, the inverse of a signal received by the input 166, a signal received by the input 168, and the inverse of a signal received by the input 170. The output of the AND gate 951 is provided to one input of a two input OR gate 955. A seven input AND gate 953 receives the inverse of a signal received by the input 915, the inverse of a signal received by the input 917, a signal received by the input 919, a signal received by the input 921, the inverse of a signal received by the input 166, a signal received by the input 168, and the inverse of a signal received by the input 170. The output of the AND gate 953 is provided to the other input of the two input OR gate 955. The output of the two input OR gate 955 is provided to the output 182 of the gain control unit 172.

A seven input AND gate 957 receives the inverse of a signal received by the input 915, the inverse of a signal received by the input 917, the inverse of a signal received by the input 919, a signal received by the input 921, the inverse of a signal received by the input 166, a signal received by the input 168, and the inverse of a signal received by the input 170. The output of the AND gate 957 is provided to a first input of a four input NOR gate 965. A seven input AND gate 959 receives the inverse of a signal received by the input 915, the inverse of a signal received by the input 917, a signal received by the input 919, a signal received by the input 921, the inverse of a signal received by the input 166, a signal received by the input 168, and the inverse of a signal received by the input 170. The output of the AND gate 959 is provided to a second input of the four input NOR gate 965. A seven input AND gate 961 receives the inverse of a signal received by the input 915, a signal received by the input 917, a signal received by the input 919, the inverse of a signal received by the input 921, the inverse of a signal received by the input 166, a signal received by the input 168, and the inverse of a signal received by the input 170. The output of the AND gate 961 is provided to a third input of the four input NOR gate 965. A seven input AND gate 963 receives a signal received by the input 915, the inverse of a signal received by the input 917, the inverse of a signal received by the input 919, the inverse of a signal received by the input 921, the inverse of a signal received by the input 166, a signal received by the input 168, and the inverse of a signal received by the input 170. The output of the AND gate 963 is provided to a fourth input of the four input NOR gate 965. The output of the four input NOR gate 965 is provided to the output 184 of the gain control unit 172.

A seven input AND gate 967 receives a signal received by the input 915, the inverse of a signal received by the input 917, the inverse of a signal received by the input 919, the inverse of a signal received by the input 921, the inverse of a signal received by the input 166, a signal received by the input 168, and the inverse of a signal received by the input 170. The output of the AND gate 967 is provided to one input of a two input OR gate 971. A seven input AND gate 969 receives the inverse of a signal received by the input 915, a signal received by the input 917, a signal received by the input 919, the inverse of a signal received by the input 921, the inverse of a signal received by the input 166, a signal received by the input 168, and the inverse of a signal received by the input 170. The output of the AND gate 969 is provided to the other input of the two input OR gate 971. The output of the two input OR gate 971 is provided to the output 186 of the gain control unit 172.

A four input AND gate 973 receives the inverse of a signal received by the input 915, the inverse of a signal received by the input 917, the inverse of a signal received by the input 919, and the inverse of a signal received by the input 921. The output of the AND gate 973 is provided to a first input of a five input OR gate 983. A four input AND gate 975 receives the inverse of a signal received by the input 915, the inverse of a signal received by the input 917, a signal received by the input 919, and the inverse of a signal received by the input 921. The output of the AND gate 975 is provided to a second input of the five input OR gate 983. A four input AND gate 977 receives the inverse of a signal received by the input 915, a signal received by the input 917, the inverse of a signal received by the input 919, and the inverse of a signal received by the input 921. The output of the AND gate 977 is provided to a third input of the five input OR gate 983. A four input AND gate 979 receives the inverse of a signal received by the input 915, a signal received by the input 917, the inverse of a signal received by the input 919, and a signal received by the input 921. The output of the AND gate 979 is provided to a fourth input of the five input OR gate 983. A four input AND gate 981 receives the inverse of a signal received by the input 915, a signal received by the input 917, a signal received by the input 919, and a signal received by the input 921. The output of the AND gate 981 is provided to a fifth input of the five input OR gate 983. The output of the five input OR gate 983 is provided to the output 176 of the gain control unit 172.

Figure 11:
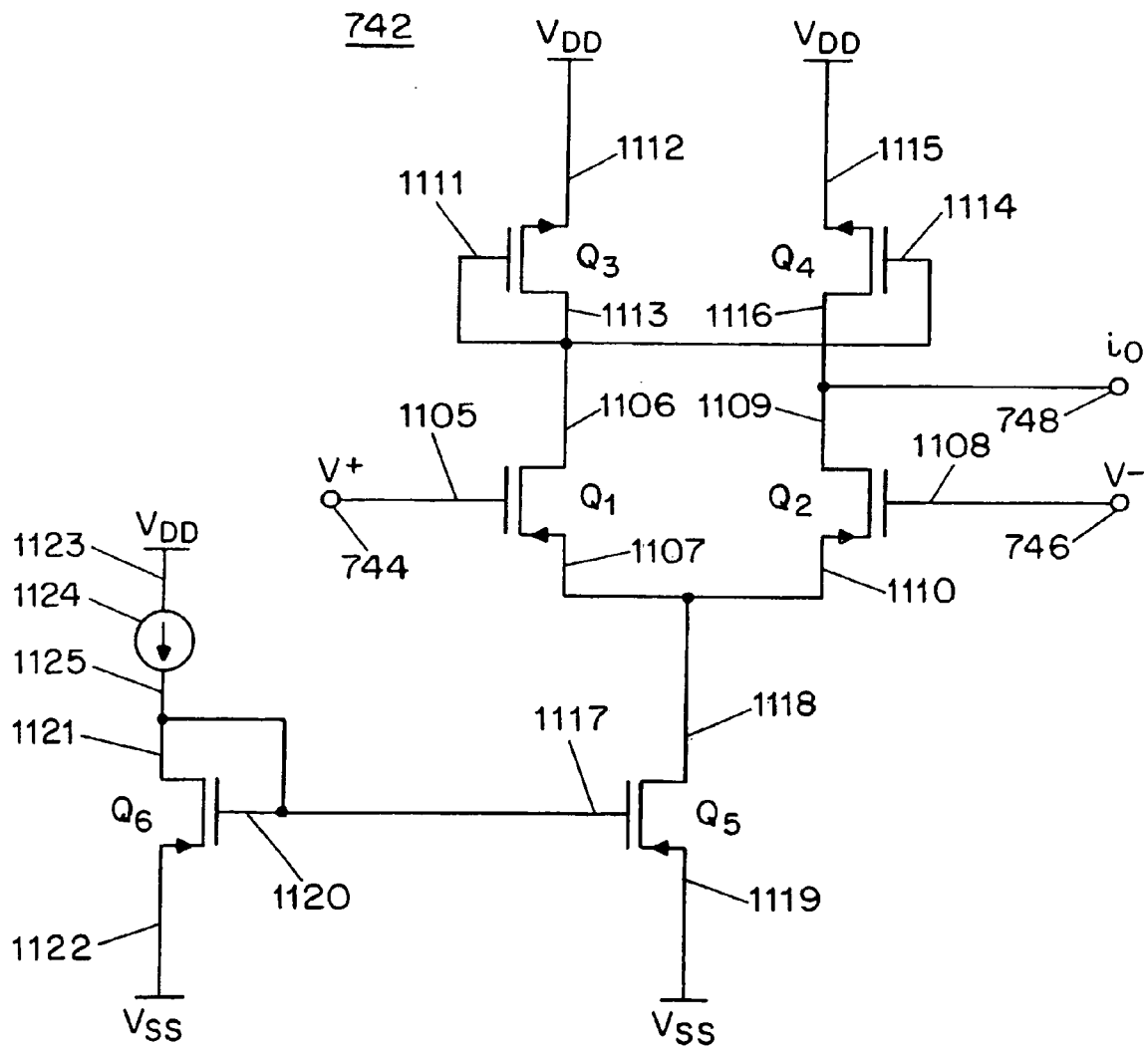
FIG. 11 is a circuit diagram illustrating a transconductor of a signal processing system in accordance with the present invention.

FIG. 11 illustrates an exemplary embodiment of the transconductor 742 in the peak detector 604 depicted in FIG. 7 in greater detail. The transconductor 742 includes an NMOS transistor $Q_1$, an NMOS transistor $Q_2$, a PMOS transistor $Q_3$, a PMOS transistor $Q_4$, an NMOS transistor $Q_5$, an NMOS transistor $Q_6$, and a current source 1124.

A signal received by the positive input 744 of the transconductor 742 is applied to the gate 1105 of the NMOS transistor $Q_1$. The NMOS transistor $Q_1$ allows current to flow from its source 1107 to its drain 1106, or vice versa, depending on the signal at the gate 1105 and the relative voltages at its source 1107 and at its drain 1106. The drain 1106 of the NMOS transistor $Q_1$ is connected to the drain 1113 and the gate 1111 of the PMOS transistor $Q_3$, and the gate 1114 of the PMOS transistor $Q_4$. The source 1107 of the NMOS transistor $Q_1$ is connected to the drain 1118 of the NMOS transistor $Q_5$ and the source 1110 of the NMOS transistor $Q_2$.

A signal received by the negative input 746 of the transconductor 742 is applied to the gate 1108 of the NMOS transistor $Q_2$. The drain 1109 of the NMOS transistor $Q_2$ is connected to the drain 1116 of the PMOS transistor $Q_4$ and the output 748 of the transconductor 742. The source 1110 of the NMOS transistor $Q_2$ is connected to the drain 1118 of the NMOS transistor $Q_5$, and the source 1107 of the NMOS transistor $Q_1$.

The drain 1113 of the PMOS transistor $Q_3$ is connected to the drain 1106 of the NMOS transistor $Q_1$, the gate 1111 of the PMOS transistor $Q_3$, and the gate 1114 of the PMOS transistor $Q_4$. The source 1112 of the PMOS transistor $Q_3$ is connected to supply voltage $V_{dd}$.

The source 1115 of the PMOS transistor $Q_4$ is connected to supply voltage $V_{dd}$.

The drain 1118 of the NMOS transistor $Q_5$ is connected to the source 1107 of the NMOS transistor $Q_1$ and the source 1110 of the NMOS transistor $Q_2$. The source 1119 of the NMOS transistor $Q_5$ is connected to supply voltage $V_{SS}$. The gate 1117 of the NMOS transistor $Q_5$ is connected to the gate 1120 and the drain 1121 of the NMOS transistor $Q_6$, and the negative terminal 1125 of the current source 1124. The positive terminal 1123 of the current source 1124 is connected to supply voltage $V_{DD}$.

The source 1122 of the NMOS transistor $Q_6$ is connected to supply voltage $V_{SS}$.

The current source 1124 produces a bias current $I_{bias}$ for the transconductor 332. The bias current $I_{bias}$ produced by the current source 1124 is adjusted to give a stable center frequency in the presence of fabrication tolerances and temperature variations. The bias current $I_{bias}$ can be any value, for example 100 micro-amperes, and the transistors $Q_1$, $Q_2$, $Q_3$, $Q_4$, $Q_5$, $Q_6$ of the transconductor 742 are scaled to yield the desired transconductances. The transconductance for the transconductors is calculated using the equation:

$$G_m = I_{tail}/(V_{GS}-V_T), \quad (3)$$

where $I_{tail}$ is the current passing through the transistor $Q_5$, $V_T$ is the threshold voltage of transistors $Q_5$ and $Q_6$, and $V_{GS}$ is the gate-source voltage of the transistors $Q_5$, $Q_6$. The linear range of the transconductor is related to the quantity $V_{GS}-V_T$. Once the bias current $I_{bias}$ has been set, the transistors $Q_5$, $Q_6$ are scaled such that, the following equation is satisfied:

$$(W_{Q5}/L_{Q5})/(W_{Q6}/L_{Q6})=I_{tail}/I_{bias}, \quad (4)$$

where $W_{Q5}$ and $L_{Q5}$ are the width and length of the channel of NMOS transistor $Q_5$, respectively, and $W_{Q6}$ and $L_{Q6}$ are the width and length of the channel of NMOS transistor $Q_6$, respectively. The positive terminal of the current source 1124 is connected to supply voltage $V_{dd}$. The preferred form of the current source 1124 is a resistor connected to the between the supply voltage $V_{dd}$ and the drain 1121 and the gate 1120 of the NMOS transistor $Q_6$.

The invention claimed is:

1. An active filter system comprising:
a system input for receiving a system input signal;
a system output for providing a system output signal;
a main filter having at least one successive filter stage having an input and an output, including a first filter stage, each filter stage having an associated input amplification stage including a signal input, a signal output coupled to the input of the associated filter stage and a gain control input for receiving a gain control signal that determines the amplification factor of the associated input amplification stage, the input of the input amplification stage associated with each filter stage, except for the input amplification stage associated with the first filter stage, being coupled to the output of a preceding filter stage the input of the amplification stage associated with the first filter stage being coupled to the system input, each filter stage having an associated output amplification stage including a signal input coupled to the output of the associated filter stage, a signal output and a gain control input for receiving a gain control signal that determines the amplification factor of the associated output amplification stage, the signal output of the output amplification stage associated with a selected one of the at least one filter stage being coupled to the system output;
a strength detector having an input coupled to the output of the first filter stage, and having a first output and a second output for providing respective output signals indicative of whether the first filter stage is approaching saturation or is providing an output signal having less than a minimum acceptable signal to noise ratio;
a zero crossing detector having at least one input coupled to respective ones of the at least one output of the at least one filter stage of the main filter, and having at least one output for providing at least one signal indicative of when a successive one of the at least one filter stage of the main filter provides a signal at its output that is approximately equal to zero; and
a gain control unit having a first input and a second input respectively coupled to the output of the strength detector and coupled to the at least one output of the zero crossing detector, and having a multiplicity of outputs for providing respective gain control signals to the gain control input of each input amplification stage and each output amplification stage associated with the at least one filter stage of the main filter, the gain control unit being responsive to signals provided initially by the strength detector indicative of the first filter stage approaching saturation or providing an output signal having less than the minimum acceptable signal to noise ratio, and a signal from the zero crossing detector indicative of the output signal provided by the first filter stage being approximately equal to zero for providing a gain control signal to the gain control input of the input amplification stage associated with the first filter stage so that the input amplification stage associated with the first filter stage has an amplification factor that results in a signal strength at its signal output which avoids saturation of the first filter stage and avoids the first filter stage providing a signal having less than the minimum acceptable signal to noise ratio, and for providing a gain control signal to the gain control input of the output amplification stage associated with the first filter stage so that the output amplification stage associated with the first filter stage has an amplification factor which is the reciprocal of the amplification factor of the input amplification stage associated with the first filter stage, the gain control unit being thereafter responsive to signals provided initially by the strength detector indicative of the first filter stage of the main filter approaching saturation or providing an output having less than the minimum acceptable signal to noise ratio, and to a signal from the zero crossing detector indicating that an output signal at the output of a successive filter stage, being approximately equal to zero for providing a gain control signal to the gain control input of the input amplification stage associated with the successive filter stage so that the input amplification stage associated with the successive filter stage has an amplification factor that results in a signal strength at its signal output that avoids saturation of the successive filter stage and avoids the successive filter stage providing a signal having less than the minimum acceptable signal to noise ratio, and for providing a gain control signal to the gain control input of the output amplification stage associated with the successive filter stage so that the output amplification stage associated with the successive filter stage has an amplification factor which is a reciprocal of the amplification factor of the input amplification stage associated with the successive filter stage.

2. An active filter system according to claim 1, wherein the at least one filter stage of the main filter comprises a first filter stage and a second filter stage, and the zero crossing detector comprising:

a switching unit having a first signal input coupled to the output of the first filter stage, a second signal input coupled to the output of the second filter stage, a switch control input, and a signal output, the switching unit being responsive to a first switch control signal received by the switch control terminal for connecting the first signal input to the signal output and disconnecting the second signal input from the signal output, and being responsive to a second switch control signal received by the switch control terminal for connecting the second signal input to the signal output and disconnecting the first signal input from the signal output;

a comparator having a signal input coupled to the signal output of the switching unit, and a signal output for providing an output signal, the comparator providing a first logical signal on the signal output when the signal received at the signal input is approximately equal to zero, and providing a second logical signal on the signal output when the signal received at the signal input is not approximately equal to zero; and a three-stage shift register having a clock input coupled to the signal output of the comparator, a reset/enable input, a first stage output, a second stage output and a third stage output, the shift register being responsive to a first logical signal received at the reset/enable input for producing a first logical signal at the first stage output, a second logical signal at the second stage output and a second logical signal at the third stage output, and being responsive to receiving the second logical signal at the reset/enable input and a signal changing from the second logical signal to the first logical signal at the clock input while having the first logical signal at the first stage output, the second logical signal at the second stage output and the second logical signal at the third stage output for providing the second logical signal at the first stage output, the first logical signal at the second stage output and the second logical signal at the third stage output, the shift register being responsive to the first logical signal received at the reset/enable input and a signal changing from the second logical signal to the first logical signal at the clock input while having the second logical signal at the first stage output, the first logical signal at the second stage output and the second logical signal at the third stage output for providing the second logical signal at the first stage output, the second logical signal at the second stage output and the first logical signal at the third stage output, and being responsive to the first logical signal received at the reset/enable input and a signal changing from the second logical signal to the first logical signal at the clock input while having the second logical signal at the first stage output, the second logical signal at the second stage output and the first logical signal at the third stage output for providing the second logical signal at the first stage output, the second logical signal at the second stage output and the first logical signal at the third stage output, and wherein the first stage output, the second stage output and the third stage output are the output signals of the zero crossing detector provided to the gain control unit, and the first stage output is also the switch control terminal of the switching unit.

3. The active filter system of claim 2, wherein the gain control unit has a first zero cross input coupled to the first stage output of the shift register and the switch control input of the switching unit, a second zero cross input coupled to the second stage output of the shift register, a third zero cross input coupled to the third stage output of the shift register, a reset/enable output for providing a reset/enable signal to the reset/enable input of the shift register, a first gain control output terminal, a second gain control output terminal, a third gain control output terminal, a fourth gain control output terminal and a fifth gain control output terminal;

the gain control unit being responsive to receiving a first signal from the strength detector indicative of the first filter stage providing a signal having less than the minimum acceptable signal to noise ratio when the first gain control terminal is providing a second logical signal, the second gain control terminal is providing the second logical signal, the third gain control terminal is providing the second logical signal, the fourth gain control terminal is providing a first logical signal and the fifth gain control terminal is providing the second logical signal, for providing the second logical signal on the reset/enable output, and being thereafter responsive to receiving the second logical signal on the first zero cross input, the first logical signal on the second zero cross input and the second logical signal on the third zero cross input for providing the second logical signal on the reset/enable output, the second logical signal on the first gain control output terminal, the first logical signal on the second gain control output terminal, the second logical signal on the third gain control output terminal, the second logical signal on the fourth gain control output terminal and the first logical signal on the fifth gain control output terminal, and being thereafter responsive to receiving the second logical signal on the first zero cross input, the second logical signal on the second zero cross input and the first logical signal on the third zero cross input for providing the second logical signal on the reset/enable output, the first logical signal on the first gain control output terminal, the second logical signal on the second gain control output terminal, the second logical signal on the third gain control output terminal, the first logical signal on the fourth gain control output terminal and the second logical signal on the fifth gain control output terminal;

the gain control unit being responsive to receiving a signal from the signal strength detector indicative of the first filter stage providing a signal having less than the minimum acceptable signal to noise ratio while the first gain control output terminal is providing the first logical signal, the second gain control output terminal is providing the second logical signal, the third gain control output terminal is providing the second logical signal, the fourth gain control output terminal is providing the first logical signal and the fifth gain control output is providing the second logical signal, for providing after a particular time delay the second logical signal on the reset/enable output, and being thereafter responsive to receiving the second logical signal on the first zero cross input, the first logical signal on the second zero cross input and the second logical signal on the third zero cross input for providing the second logical signal on the reset/enable output, the second logical signal on the first gain control output terminal, the first logical signal on the second gain control output terminal, the first logical signal on the third gain control output terminal, the second logical signal on the fourth gain control output terminal and the second logical signal on the fifth gain control output terminal, and being thereafter responsive to receiving the second logical signal on the first zero cross input, the second logical signal on the second zero cross input and the first logical signal on the third zero cross input for providing the second logical signal on the reset/enable output, the second logical signal on the first gain control output terminal, the first logical terminal on the second gain control output terminal, the second logical signal on the third gain control output terminal, the first logical signal on the fourth gain control output terminal and the second logical signal on the fifth gain control output terminal;

the gain control unit being responsive to receiving a signal from the strength detector indicative of the first filter stage approaching saturation while the first gain control output is providing the second logical signal, the second gain control output is providing the first logical signal, the third gain control output terminal is providing the second logical signal, the fourth gain control output is providing the second logical signal and the fifth gain control output terminal is providing the second logical signal, for providing after a particular time delay the second logical signal on the reset/enable output, and being thereafter responsive to receiving the second logical signal on the first zero cross input, the first logical signal on the second zero cross input and the second logical signal on the third zero cross input for providing the second logical signal on the reset/enable output, the second logical signal on the first gain control output terminal, the second logical signal on the second gain control output terminal, the first logical signal on the third gain control output terminal, the second logical signal on the fourth gain control output terminal and the second logical signal on the fifth gain control output terminal, and being thereafter responsive to receiving the second logical signal on the first zero cross input, the second logical signal on the second zero cross input and the first logical signal on the third zero cross input for providing the second logical signal on the reset/enable output, the second logical signal on the first gain control output terminal, the second logical signal on the second gain control output terminal, the second logical signal on the third gain control output terminal, the first logical signal on the fourth gain control output terminal and the second logical signal on the fifth gain control output terminal, and wherein: the gain control input of the input amplification stage associated with the first filter stage comprises a first gain control terminal and a second grain control terminal, the first gain control terminal of the input amplification stage associated with the first filter stage of the main filter being coupled to the first gain control output terminal of the gain control unit, and the second gain control terminal of the input amplification stage associated with the first filter stage of the main filter is coupled to the second gain control output terminal of the gain control unit, the input amplification stage associated with the first filter stage being responsive to receiving the second logical signal on its first gain control terminal and the second logical signal on its second gain control terminal for amplifying the input signal by a first amplification factor, and being responsive to receiving the second logical signal on the first gain control terminal and the first logical signal on the second gain control terminal for amplifying the input signal by a second amplification factor which is greater than the first amplification factor, and being responsive to receiving the first logical signal on the first gain control terminal and the second logical signal on the second gain control terminal for amplifying the input signal by a third amplification factor which is greater than the second amplification factor;

the gain control input of the output amplification stage associated with the first filter stage comprises a first gain control terminal and a second gain control terminal, the first gain control terminal of the output amplification stage associated with the first filter stage being coupled to the first gain control output terminal of the gain control unit, the second gain control terminal of the output amplification stage associated with the first filter stage is coupled to the second gain control output terminal of the gain control unit, the output amplification stage associated with the first filter stage being responsive to receiving the second logical signal on its first gain control terminal and the second logical signal on its second gain control terminal for amplifying a signal provided by the output of the first filter stage by the third amplification factor, and being responsive to receiving the second logical signal on its first gain control terminal and the first logical signal on its second gain control terminal for amplifying the signal provided by the output of the first filter stage by the second amplification factor, and being responsive to receiving the first logical signal on the first gain control terminal and the second logical signal on the second gain control terminal for amplifying the signal provided by the output of the first filter stage by the first amplification factor;

the gain control input of the input amplification stage associated with the second filter stage comprises a third grain control terminal and a fourth gain control terminal, the third gain control terminal of the input amplification stage associated with the second filter stage being coupled to the third gain control output terminal of the gain control unit, and the fourth gain control terminal of the input amplification stage associated with the second filter stage is coupled to the fourth gain control output terminal of the gain control unit, the input amplification stage associated with the second filter stage being responsive to receiving the first logical signal on its third gain control terminal and the second logical signal on its fourth gain control terminal for amplifying a signal provided by the output of the first filter stage by a fourth amplification factor, and being responsive to receiving the second logical signal on its third gain control terminal and the first logical signal on its fourth gain control terminal for amplifying the signal provided by the output of the first filter stage by a fifth amplification factor which is greater than the fourth amplification factor, and being responsive to receiving the first logical signal on its third gain control terminal and the second logical signal on its fourth gain control terminal for amplifying the signal provided by the output of the first filter stage by a sixth amplification factor which is greater than the fifth amplification factor; and the gain control input of the output amplification stage associated with the second filter stage comprises a fourth gain control terminal and a fifth gain control terminal, the fourth gain control terminal of the output amplification stage associated with the second filter stage being coupled to the fourth gain control output terminal of the gain control unit, the fifth gain control terminal of the amplification stage associated with the second filter stage being coupled to the fifth gain control unit, the output amplification stage associated with the second filter stage being responsive to receiving the second logical signal on its fourth gain control terminal and the second logical signal on its fifth gain control terminal for amplifying a signal provided by the output of the second filter stage by the fourth amplification factor, and being responsive to receiving the second logical signal on its fourth gain control terminal and the first logical signal on its fifth gain control terminal for amplifying the signal provided by the output of the second filter stage by the sixth amplification factor, and being responsive to receiving the first logical signal on its fourth gain control terminal and the second logical signal on its fifth gain control terminal for amplifying the signal provided by the output of the second filter stage by the fifth amplification factor.

4. The active filter system of claim 3, wherein the signal strength detector comprises:

a peak detector having an input coupled to the output of the first filter stage of the main filter and an output, the peak detector detecting a voltage envelope peak of the signal provided by the output of the first filter stage and providing a signal representative of the voltage envelope peak at its output;

a first threshold detector having an input coupled to the output of the peak detector and an output, the first threshold detector comparing the signal provided by the peak detector with a first threshold representative of a signal strength at the input of the first filter stage that would cause the first filter stage to approach saturation, the first threshold detector providing the first logical signal at its output when the signal received from the peak detector is less than the first threshold, and providing the second logical signal at its output when the signal received from the peak detector is greater than or equal to the first threshold; and a second threshold detector having an input coupled to the output of the peak detector and an output, the second threshold detector comparing the signal from the peak detector with a second threshold representative of an input signal strength at the input of the first filter stage that would cause a signal provided by the output of the first filter to have less than a minimum acceptable signal to noise ratio, the second threshold detector providing the first logical signal at its output when the signal from the peak detector is greater than or equal to the second threshold, and for providing the second logical signal at its output when the signal from the peak detector is less than the second threshold, wherein the output of the first threshold detector and the output of the second threshold detector comprise the first and second outputs of the strength detector, respectively.

5. The active filter system of claim 3, wherein the first filter stage comprises a first integrator having an input and an output, and the second filter stage comprises a second integrator having an input and an output.

6. The active filter system of claim 2, wherein the input of the output amplification stage associated with the second filter stage is coupled to the output of the second filter stage, and the output of the output amplification stage associated with the second filter stage is coupled to the signal input of the input amplification stage associated with the second filter stage, and wherein the signal output of the output amplification stage associated with the first filter stage is coupled to the system output.

7. The active filter system of claim 2, wherein the input amplification stage associated with the first filter stage includes circuitry for clamping an output signal provided by the input amplification stage so as to prevent saturation of the first filter stage.

8. The active filter system of claim 2, wherein the input amplification stage associated with the second filter stage includes circuitry for clamping an output signal provided by the input amplification stage so as to prevent saturation of the second filter stage.

9. The active filter system of claim 6, wherein the output amplification stage associated with the second filter stage includes circuitry for clamping an output signal provided by the output amplification stage so as to prevent saturation of the second filter stage.

10. An active filter system according to claim 5, wherein the input amplification stage associated with the first filter stage includes:
a first resistor;
a second resistor;
a third resistor;
a fourth resistor;
a capacitor;

a first switch having a first terminal, a second terminal and a switch control terminal;

a second switch having a first terminal, a second terminal and a switch control terminal; and an operational amplifier having an inverted input, a normal input and an output, the first resistor being connected between the system input and the inverting input of the operational amplifier, the second resistor being connected between the system input and the first terminal of the first switch, the third resistor being connected between the system input and the first terminal of the second switch, the second terminal of the first switch being coupled to the inverting input of the operational amplifier, the second terminal of the second switch being coupled to the inverting input of the operational amplifier, the fourth resistor being coupled between the output and the inverting input of the operational amplifier, the capacitor being coupled between the output and the inverting input of the operational amplifier, the normal input of the operational amplifier being coupled to ground, the switch control terminal of the first switch being coupled to the second gain control terminal, the switch control terminal of the second switch being coupled to the first gain control terminal, wherein each of the first switch and the second switch is responsive to receiving the first logical signal on its switch control terminal for connecting its first terminal to its second terminal, and is responsive to receiving the second logical signal on its switch control terminal for disconnecting its first terminal from its second terminal.

11. The active filter system of claim 10, wherein the first resistor has a resistance of 200 kΩ, the second resistor has a resistance of 22.22 kΩ, the third resistor has a resistance of 2.02 kΩ, the fourth resistor has a resistance of 20 kΩ, and the capacitor has a capacitance of 80 pF.

12. The active filter system of claim 5, wherein the first integrator comprises:

a resistor;

a capacitor; and an operational amplifier having an inverting input, a normal input and an output, the resistor being coupled between the output and the inverting input of the operational amplifier, the capacitor being coupled between the output and the inverting input of the operational amplifier, the normal input of the operational amplifier being coupled to ground, the inverting input of the operational amplifier being coupled to the input of the first integrator, and the output of the operational amplifier being coupled to the output of the first integrator.

13. The active filter system of claim 12, wherein the resistor has a resistance of 20 kΩ and the capacitor has a capacitance of 80 pF.

14. The active filter system of claim 5, wherein the output amplification stage associated with the first filter stage comprises:

a first resistor;

a second resistor;

a third resistor;

a fourth resistor;

a first switch having a first terminal, a second terminal and a switch control terminal;

a second switch having a first terminal, a second terminal and a switch control terminal; and an operational amplifier having a normal input, an inverting input and an output, the first resistor being coupled between the output of the first integrator and the inverting input of the operational amplifier, the second resistor being coupled between the output and the inverting input of the operational amplifier, the third resistor being coupled between the inverting input of the operational amplifier and the first terminal of the first switch, the fourth resistor being coupled between the inverting input of the operational amplifier and the first terminal of the second switch, the second terminal of the first switch being coupled to the output of the operational amplifier, the second terminal of the second switch being coupled to the output of the operational amplifier, the normal input of the operational amplifier being coupled to ground, the switch control terminal of the first switch being coupled to the second gain control input terminal and the switch control terminal of the second switch being coupled to the first gain control terminal, wherein each of the first switch and the second switch is responsive to receiving the first logical signal on its switch control terminal for connecting its first terminal to its second terminal, and is responsive to receiving the second logical signal on its switch control terminal for disconnecting its first terminal from its second terminal.

15. The active filter system according to claim 14, wherein the first resistor has a resistance of 20 kΩ, the second resistor has a resistance of 200 kΩ, the third resistor has a resistance of 22.22 kΩ and the fourth resistor has a resistance of 2.02 kΩ.

16. The active filter system of claim 5, wherein the input amplifier stage associated with the second filter stage comprises:

a first resistor;

a second resistor;

a third resistor;

a capacitor;

a first switch having a first terminal, a second terminal and a switch control terminal;

a second switch having a first terminal, a second terminal and a switch control terminal; and an operational amplifier having a normal input, an inverting input and an output, the first resistor being coupled between the output of the first integrator and the inverting input of the operational amplifier, the second resistor being coupled between the output of the first integrator and the first terminal of the first switch, the third resistor being coupled between the output of the first integrator and the first input of the second switch, the second terminal of the first switch being coupled to the inverting input of the operational amplifier, the second terminal of the second switch being coupled to the inverting input of the operational amplifier, the capacitor being coupled between the output and the inverting input of the operational amplifier, the normal input of the operational amplifier being coupled to ground, the switch control terminal of the first switch being coupled to the fourth gain control terminal and the switch control terminal of the second switch being coupled to the third gain control terminal, wherein each of the first switch and the second switch is responsive to receiving a first logical signal on its switch control terminal for connecting its first terminal to its second terminal, and is responsive to receiving the second logical signal on its switch control terminal for disconnecting its first terminal from its second terminal.

17. The active filter system of claim 16, wherein the first resistor has a resistance of 10 kΩ, the second resistor has a resistance of 1.01 kΩ, the third resistor has a resistance of 0.10 kΩ and the capacitor has a capacitance of 80 pF.

18. The active filter system of claim 5, wherein the second integrator comprises a capacitor, and an operational amplifier having a normal input, an inverting input and an output, the capacitor being coupled between the output and the inverting input of the operational amplifier, the inverting input of the operational amplifier being coupled to the input of the second integrator, the output of the operational amplifier being coupled to the output of the second integrator, the normal input of the operational amplifier being coupled to ground.

19. The active filter system of claim 6, wherein the output amplification stage associated with the second filter stage comprises:
   a first resistor;
   a second resistor;
   a third resistor;
   a fourth resistor;
   a fifth resistor;
   a sixth resistor;
   a capacitor;
   a first switch having a first terminal, a second terminal and a switch control terminal;
   a second switch having a first terminal, a second terminal and a switch control terminal;
   a first operational amplifier having a normal input, an inverting input and an output; and
   a second operational amplifier having a normal input, an inverting input and an output, the first resistor being coupled between the output of the second integrator and the inverting input of the first operational amplifier, the second resistor being coupled between the output and the inverting input of the first operational amplifier, the third resistor being coupled between the output of the first operational amplifier and the inverting input of the second operational amplifier, the fourth resistor being coupled between the inverting input of the second operational amplifier and the first terminal of the first switch, the fifth resistor being coupled between the inverting input of the second operational amplifier and the first terminal of the second switch, the second terminal of the first switch being coupled to the output of the first operational amplifier, the second terminal of the second switch being coupled to the output of the first operational amplifier, the normal output of the first operational amplifier being coupled to ground, the sixth resistor being coupled between the output and the inverting input of the second operational amplifier, the capacitor being coupled between the output and the inverting input of the second operational amplifier and the normal input of the second operational amplifier being coupled to ground, wherein each of the first switch and the second switch is responsive to receiving the first logical signal on its switch control terminal for connecting its first terminal to its second terminal, and is responsive to receiving the second logical signal on its switch control terminal for disconnecting its first terminal from its second terminal.

20. The active filter system of claim 19, wherein the first resistor has a resistance of 10 kΩ, the second resistor has a resistance of 10 kΩ, the third resistor has a resistance of 10 kΩ, the fourth resistor has a resistance of 1.11 kΩ, the fifth resistor has a resistance of 0.10 kΩ, the sixth resistor has a resistance of 20 kΩ, and the capacitor has a capacitance of 80 pF.

21. The active filter system of claim 4, wherein the gain control unit comprises a multiple state logic circuit responsive to the signals provided by the first and second threshold detectors of the strength detector, and the signals received at the first zero cross input, the second zero cross input and the third zero cross input for deriving respective signals on the first gain control output terminal, the second gain control output terminal, the third gain control output terminal, the fourth gain control output terminal and the fifth gain control output terminal.

* * * * *